(12) United States Patent
Wu et al.

(10) Patent No.: US 9,807,867 B2
(45) Date of Patent: Oct. 31, 2017

(54) INTERCONNECT STRUCTURE AND METHOD OF MANUFACTURING THE SAME

(71) Applicant: TAIWAN SEMICONDUCTOR MANUFACTURING CO., LTD., Hsinchu (TW)

(72) Inventors: Jiun-Yi Wu, Taoyuan (TW); Chien-Hsun Lee, Hsinchu County (TW); Chewn-Pu Jou, Hsinchu (TW); Fu-Lung Hsueh, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/016,147

(22) Filed: Feb. 4, 2016

(65) Prior Publication Data

US 2017/0231083 A1    Aug. 10, 2017

(51) Int. Cl.
*H05K 1/02* (2006.01)
*H01L 21/48* (2006.01)
(Continued)

(52) U.S. Cl.
CPC ......... *H05K 1/0216* (2013.01); *H01L 21/485* (2013.01); *H01L 21/486* (2013.01); *H01L 23/49827* (2013.01); *H01L 23/552* (2013.01); *H05K 1/113* (2013.01); *H05K 1/115* (2013.01); *H05K 3/0047* (2013.01); *H05K 3/4007* (2013.01); *H05K 3/423* (2013.01);
(Continued)

(58) Field of Classification Search
CPC ....... H01L 21/76898; H01L 2224/0237; H01L 23/538

USPC .......... 257/774; 174/261, 255; 361/792, 795
See application file for complete search history.

(56) References Cited

U.S. PATENT DOCUMENTS 5,949,030 A  *  9/1999  Fasano .................. H01L 21/486
                                                          174/262
6,787,710 B2 *  9/2004  Uematsu ................ H05K 1/115
                                                          174/255
(Continued)

FOREIGN PATENT DOCUMENTS

CN        103633045 A     3/2014
JP        2011-187992 A   9/2011
(Continued)

OTHER PUBLICATIONS

Virginia Semiconductor The General Properties of Si, Ge, SiGe, SiO2 and Si3N4 Jun. 2002.*

*Primary Examiner* — Michael F McAllister
(74) *Attorney, Agent, or Firm* — Maschoff Brennan

(57) ABSTRACT

A method for manufacturing an interconnect structure and an interconnect structure are provided. The method includes: forming an opening in a substrate; forming a low-k dielectric block in the opening; forming at least one via in the low-k dielectric block; and forming a conductor in the via. The interconnect structure includes a substrate, a dielectric block, and a conductor. The substrate has an opening therein. The dielectric block is present in the opening of the substrate. The dielectric block has at least one via therein. The dielectric block has a dielectric constant smaller than that of the substrate. The conductor is present in the via of the dielectric block.

19 Claims, 22 Drawing Sheets

(51) Int. Cl.
  *H01L 23/498*   (2006.01)
  *H01L 23/552*   (2006.01)
  *H05K 3/00*     (2006.01)
  *H05K 3/42*     (2006.01)
  *H05K 3/40*     (2006.01)
  *H05K 1/11*     (2006.01)

(52) U.S. Cl.
  CPC ............. *H05K 2201/0723* (2013.01); *H05K 2201/09545* (2013.01); *H05K 2201/09645* (2013.01)

(56) References Cited

U.S. PATENT DOCUMENTS

| | | | | |
|---|---|---|---|---|
| 8,076,234 | B1* | 12/2011 | Park | H01L 21/76801 438/622 |
| 8,394,715 | B2* | 3/2013 | Volant | H01L 21/76898 257/774 |
| 8,791,550 | B1* | 7/2014 | Gu | H01L 23/5286 257/621 |
| 9,443,799 | B2* | 9/2016 | Audet | H01L 23/15 |
| 2003/0085471 | A1* | 5/2003 | Iijima | H01L 23/49827 257/774 |
| 2004/0087126 | A1 | 5/2004 | Fartash | |
| 2006/0001174 | A1* | 1/2006 | Matsui | H01L 21/76898 257/774 |
| 2010/0148370 | A1* | 6/2010 | Han | H01L 21/76898 257/774 |
| 2010/0308435 | A1 | 12/2010 | Nowak et al. | |
| 2011/0095435 | A1* | 4/2011 | Volant | H01L 21/76898 257/774 |
| 2011/0108948 | A1* | 5/2011 | Kim | H01L 21/76898 257/532 |
| 2012/0094437 | A1 | 4/2012 | Han et al. | |
| 2012/0319291 | A1* | 12/2012 | Chiou | H01L 21/76898 257/774 |
| 2014/0124258 | A1* | 5/2014 | Park | H05K 1/0216 174/388 |
| 2015/0028450 | A1 | 1/2015 | Park et al. | |

FOREIGN PATENT DOCUMENTS

| | | |
|---|---|---|
| KR | 20140058919 A | 5/2014 |
| KR | 10-2015-0012574 A | 2/2015 |

* cited by examiner

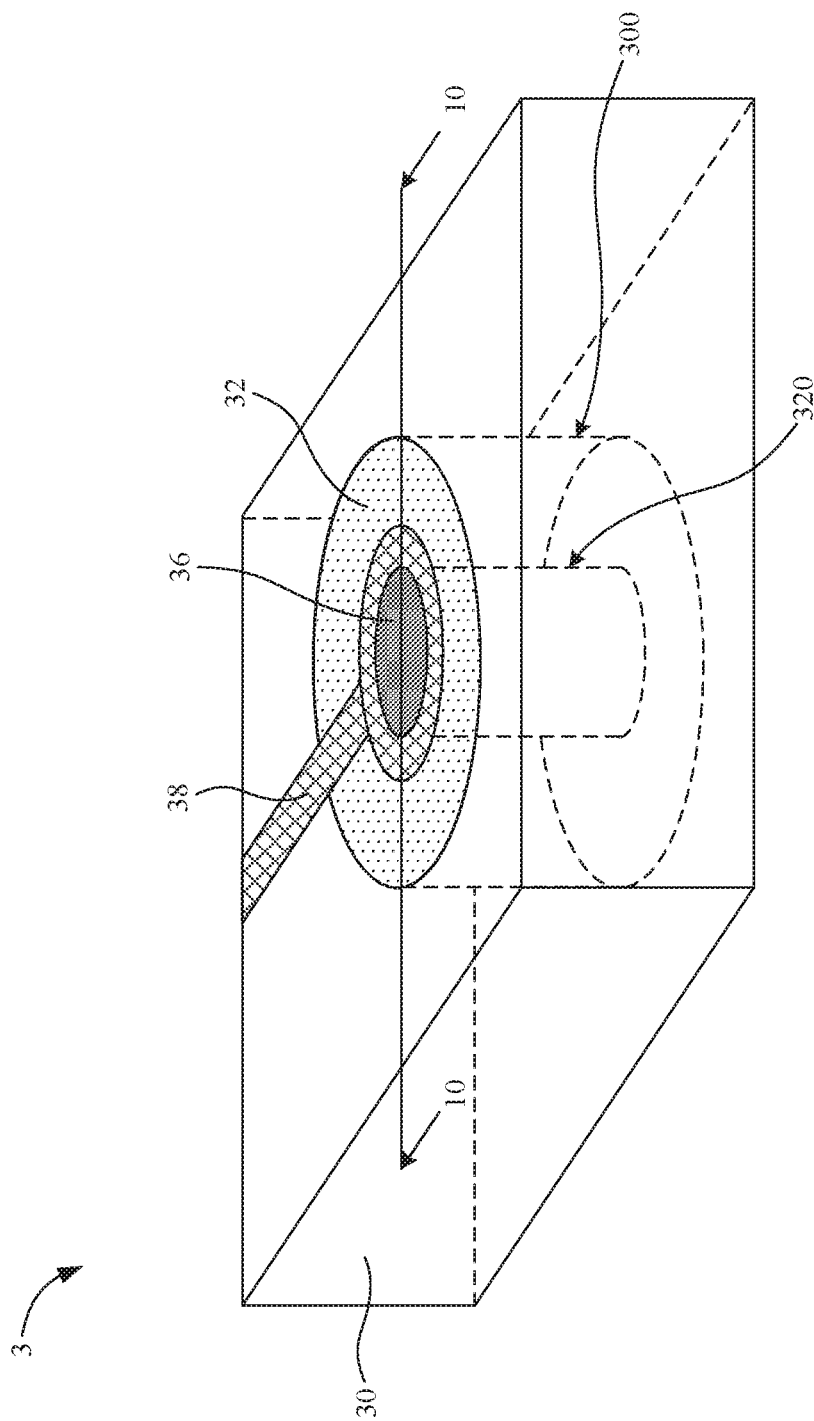

INTERCONNECT STRUCTURE AND METHOD OF MANUFACTURING THE SAME

BACKGROUND

Semiconductor devices are used in a variety of applications, such as personal computers, cell phones, digital cameras, and many other portable electronic equipments. These portable electronic equipments are small, lightweight, and produced in high volumes at relatively low cost.

Semiconductor devices such as portable electronic equipments can be divided into a simple hierarchy including devices such as integrated circuit (IC) dies, packages, printed circuit boards (PCB), and systems. The package is an interface between an IC die and a PCB. IC dies are made from semiconductor materials such as silicon. Dies are then assembled into a package. The packaged die is then attached either directly to a PCB or to another substrate, which may be a second level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a perspective view of an interconnect structure with a single end design according to some embodiments of the present disclosure;

DETAILED DESCRIPTION

Figure 1:
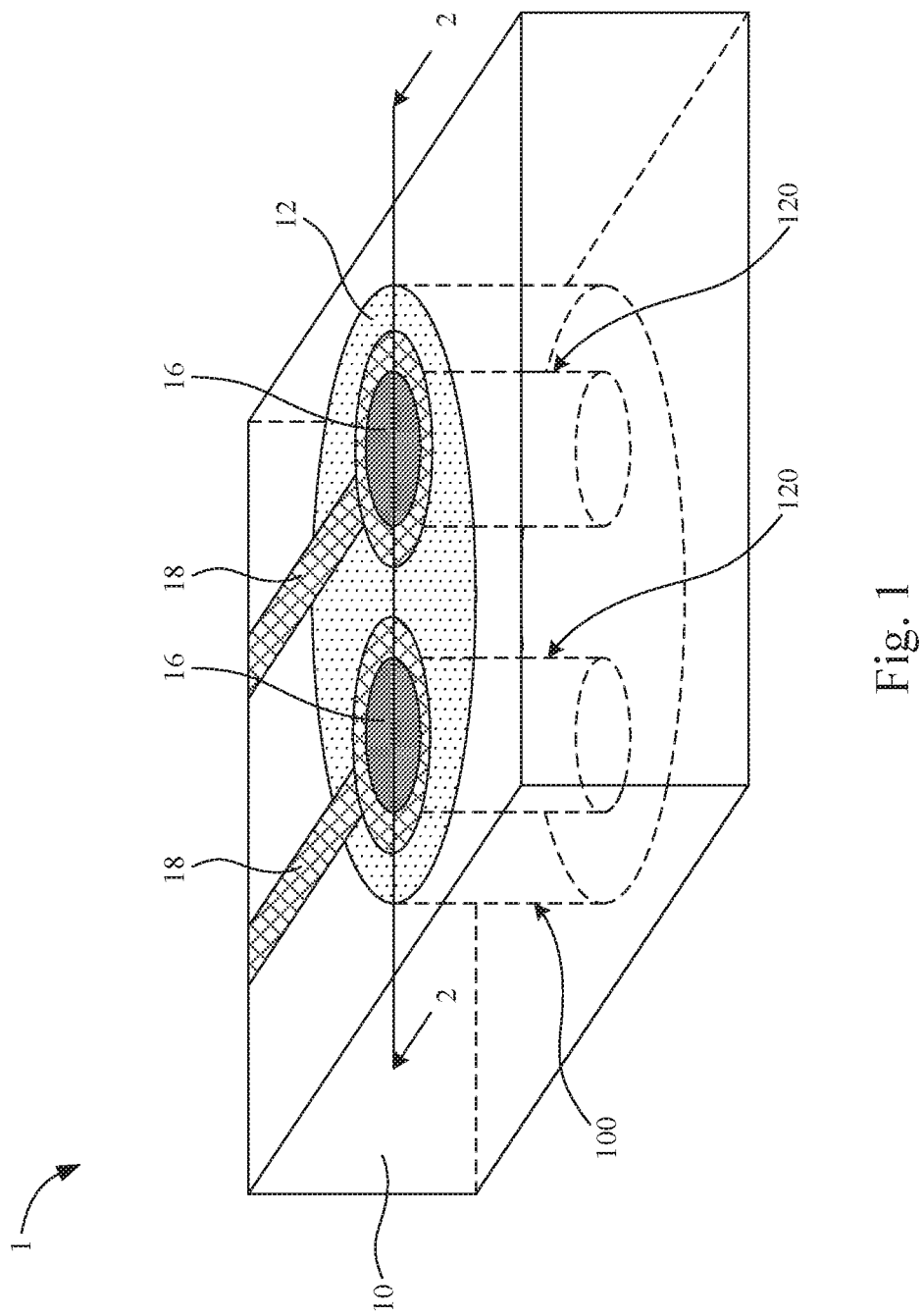
FIG. 1 is a perspective view of an interconnect structure with a differential pair design according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
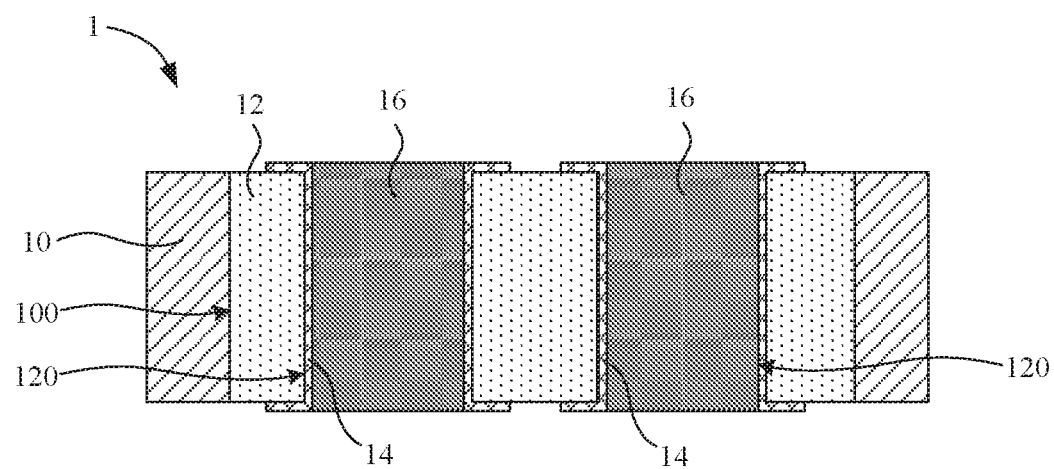
FIG. 2 is a cross-sectional view of the interconnect structure of FIG. 1 taken along line 2 according to some embodiments of the present disclosure.

FIG. 1 is a perspective view of an interconnect structure 1 with a differential pair design according to some embodiments of the present disclosure. FIG. 2 is a cross sectional view of the interconnect structure 1 of FIG. 1 taken along line 2 according to some embodiments of the present disclosure. As shown in FIGS. 1-2, in some embodiments of the present disclosure, the interconnect structure 1 includes a substrate 10, a dielectric block 12, two conductors 14, and two conductive lines 18. The substrate 10 has an opening 100 therein. The dielectric block 12 is present in the opening 100 of the substrate 10. The dielectric block 12 has two vias 120 therein, in which the dielectric block 12 has a dielectric constant smaller than a dielectric constant of the substrate 10. The conductors 14 are respectively present in the vias 120 of the dielectric block 12. In some embodiments of the present disclosure, at least one of the conductors 14 is at least partially present on a sidewall of the corresponding via 120. The conductive lines 18 are present on a surface of the substrate 10 and are respectively connected to the conductors 14.

In some embodiments of the present disclosure, the dielectric block 12 can be made of a low-k dielectric material. For example, the dielectric constant of the dielectric block 12 can be in a range from about 1 to about 4 at about 1 GHz, but various embodiments of the present disclosure are not limited in this regard.

In some embodiments of the present disclosure, the dielectric block 12 is made of a material including, for example, polyimide (PI), aromatic polymers, parylene, parylene-F, amorphous carbon, polytetrafluoroethylene (PTFE), air, or combinations thereof, but various embodiments of the present disclosure are not limited in this regard. The dielectric constant of PI is in a range from about 3 to about 4. The dielectric constant of aromatic polymers is in a range from about 2.6 to about 3.2. The dielectric constant of parylene is about 2.7. The dielectric constant of parylene-F is about 2.3. The dielectric constant of amorphous carbon is in a range from about 2.3 to about 2.8. The dielectric constant of PTFE is in a range from about 1.9 to about 2.1. The dielectric constant of air is about 1. In some embodiments of the present disclosure, the dielectric block 12 may further include resin, ink, epoxy, or combinations thereof, but various embodiments of the present disclosure are not limited in this regard.

In some embodiments of the present disclosure, the interconnect structure 1 further includes plugs 16 respectively plugged in the remaining vias 120 to prevent solder from wicking through the vias 120 during the assembly process and damaging (short-circuitry adjacent paths) the finished product. In some embodiments of the present disclosure, the plugs 16 may be made of solder mask ink, such as epoxy resin, liquid photoimageable solder mask (LPSM) ink, or combinations thereof. In some other embodiments of the present disclosure, the plugs 16 may be electrically conductive. For example, the plugs 16 may be made of epoxy resin mixed with conductive particles, such as copper particles, silver particles, or combinations thereof, but various embodiments of the present disclosure are not limited in this regard. The plugs 16 may also be thermally conductive when the plugs 16 have thermally conductive matter, such as copper particles, silver particles, or combinations thereof, therein. The thermally conductive plugs 16 in the vias 120 can improve removing heat from heat sensitive components during soldering operations. In yet some other embodiments, the plugs 16 may be non-conductive of electricity. For example, the plugs 16 may be made of epoxy resin mixed with non-conductive inorganic matter, such as ceramic, but various embodiments of the present disclosure are not limited in this regard. In some other embodiments of the present disclosure, the plugs 16 may be absent from the vias 120. In yet some other embodiments of the present disclosure, the vias 120 may be filled with the conductors 14.

Figure 3:
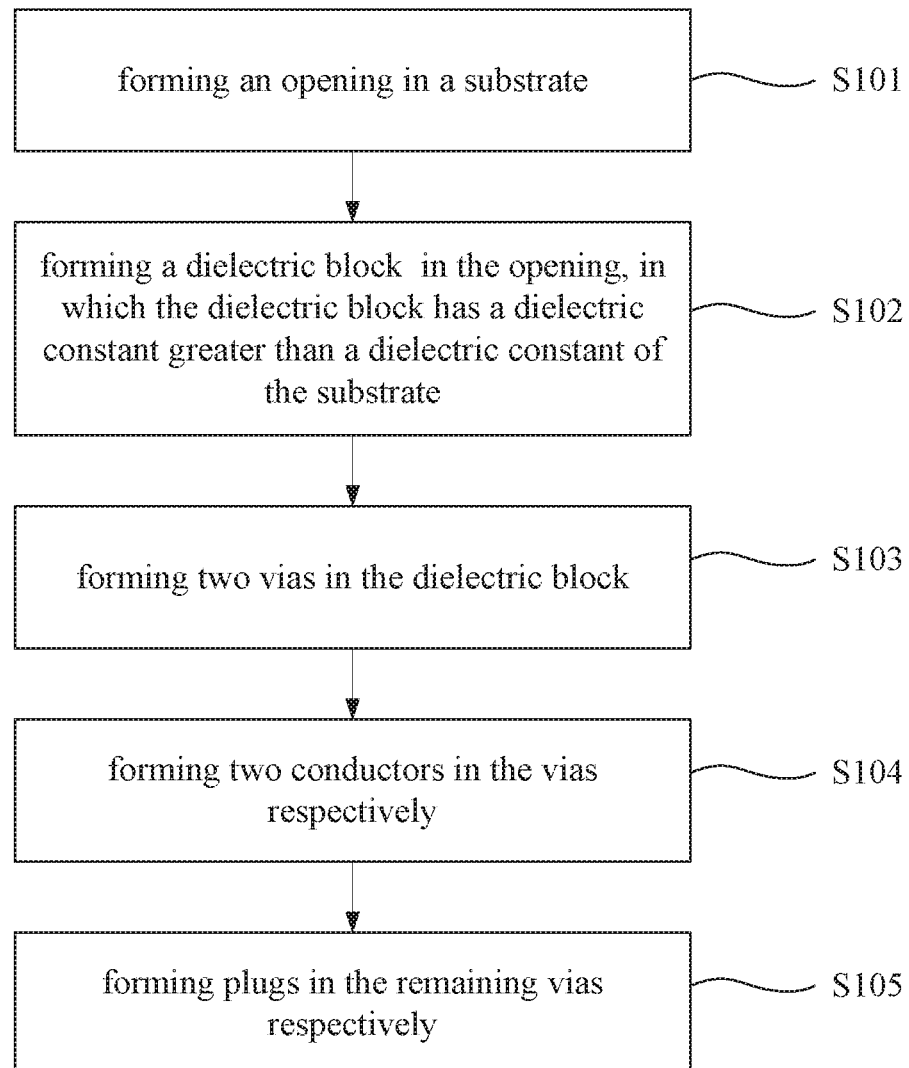
FIG. 3 is a flowchart of a method for manufacturing the interconnect structure of FIG. 1 according to some embodiments of the present disclosure.

Reference is made to FIG. 3. FIG. 3 is a flowchart of a method for manufacturing the interconnect structure 1 of FIG. 1 according to some embodiments of the present disclosure. The method begins with operation S101 in which an opening is formed in a substrate. The method continues with operation S102 in which a dielectric block is formed in the opening, and the dielectric block has a dielectric constant smaller than a dielectric constant of the substrate. The method continues with operation S103 in which two vias are formed in the dielectric block. The method continues with operation S104 in which two conductors are formed in the vias respectively. The method continues with operation S105 in which plugs are formed in the remaining vias respectively.

Figure 4A:
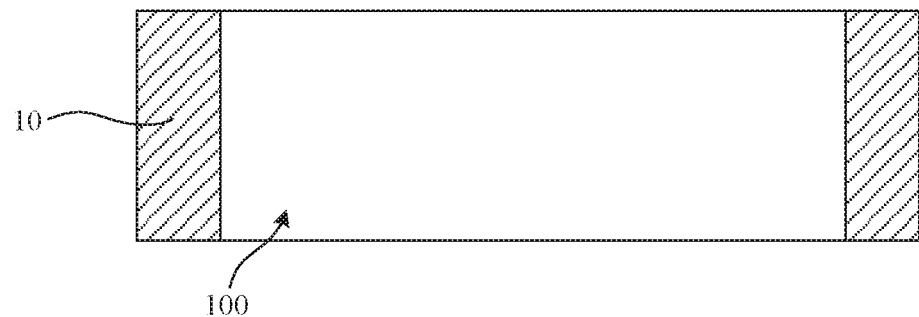
FIGS. 4A-4E are cross-sectional views taken along line 2 of FIG. 1 to sequentially illustrate steps for manufacturing the interconnect structure according to some embodiments of the present disclosure.

FIGS. 4A-4E are cross-sectional views taken along line 2 of FIG. 1 to sequentially illustrate steps for manufacturing the interconnect structure 1 according to some embodiments of the present disclosure. As shown in FIG. 4A, an opening 100 is formed in a substrate 10. In some embodiments of the present disclosure, the substrate 10 is an integrated circuit (IC) substrate. In some other embodiments of the present disclosure, the substrate 10 is a printed circuit board (PCB). For example, the substrate 10 can be made of FR-4 glass-reinforced epoxy. In yet some other embodiments of the present disclosure, the substrate 10 is a dielectric layer. The dielectric layer may be made of a polymer dielectric material, such as polyimide, benzocyclobutene (BCB), a photosensitive dielectric material, or combinations thereof. The dielectric layer is formed by, for example, spin coating.

In some embodiments of the present disclosure, the opening 100 is formed by mechanical drilling, mechanical routing, or combinations thereof when the substrate 10 is an integrated circuit (IC) substrate or a printed circuit board (PCB). In some other embodiments of the present disclosure, the opening 100 is formed by laser drilling when the substrate 10 is an IC substrate, a PCB, or a dielectric layer. The mechanical drilling is used to realize the opening 100 when the opening 100 has wide tolerance, and/or the substrate 10 has a sufficient thickness. On the other hand, the laser drilling is used to realize the opening 100 when the opening 100 has narrow tolerance, and/or the substrate 10 has a thin thickness. Although the opening 100 shown in FIG. 4A is a through hole, but various embodiments of the present disclosure are not limited in this regard. In some other embodiments of the present disclosure, the opening 100 may be a blind hole as well. The term "through hole" refers to a hole that is reamed, drilled, milled etc., through the workpiece. The term "blind hole" refers to a hole that is reamed, drilled, milled etc., to a depth without breaking through to the other side of the workpiece. In yet some other embodiments of the present disclosure, the substrate 10 may be made of a photosensitive dielectric material. The opening 100 may be formed by a photolithography process when the substrate 10 is made of a photosensitive dielectric material. Specifically, the substrate 10 is exposed to a pattern of intense light. The exposure to light causes a chemical change that allows some of the substrate 10 soluble in a photographic developer. Then, the photographic developer is applied onto the substrate 10 to remove the some of the substrate 10 soluble in the photographic developer to form the opening 100 in the substrate 10.

Figure 4B:
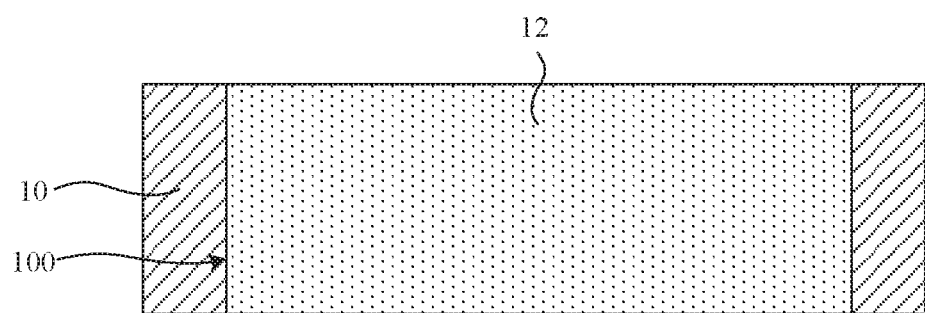

As shown in FIG. 4B, a dielectric block 12 is formed in the opening 100 of the substrate 10 by, for example, plugging the dielectric block 12 into the opening 100 of the substrate 10. In some embodiments of the present disclosure, after the dielectric block 12 is formed in the opening 100, the excess dielectric block 12 out of the opening 100 is removed by, for example, a grinding process. Therefore, after the dielectric block 12 is ground, the dielectric block 12 is substantially level with a top surface of the substrate 10.

Figure 4C:
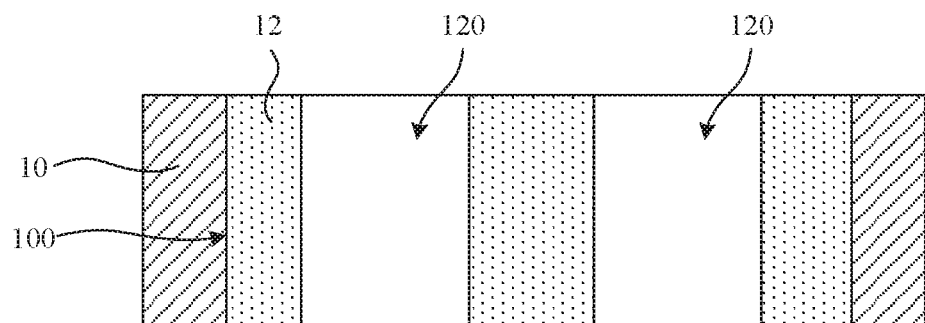

As shown in FIG. 4C, vias 120 are formed in the dielectric block 12. In some embodiments of the present disclosure, the vias 120 are formed by mechanical drilling, mechanical routing, or combinations thereof, but various embodiments of the present disclosure are not limited in this regard. For example, in some other embodiments of the present disclosure, the vias 120 can be formed by laser drilling. In yet some other embodiments of the present disclosure, the dielectric block 12 may be made of a photosensitive low-k material. The vias 120 may be formed by a photolithography process when the dielectric block 12 is made of a photosensitive low-k material. Specifically, the dielectric block 12 is exposed to a pattern of intense light. The exposure to light causes a chemical change that allows some of the dielectric block 12 soluble in a photographic developer. Then, the photographic developer is applied onto the dielectric block 12 to remove the some of the dielectric block 12 soluble in the photographic developer to form the vias 120 in the dielectric block 12.

Figure 4D:
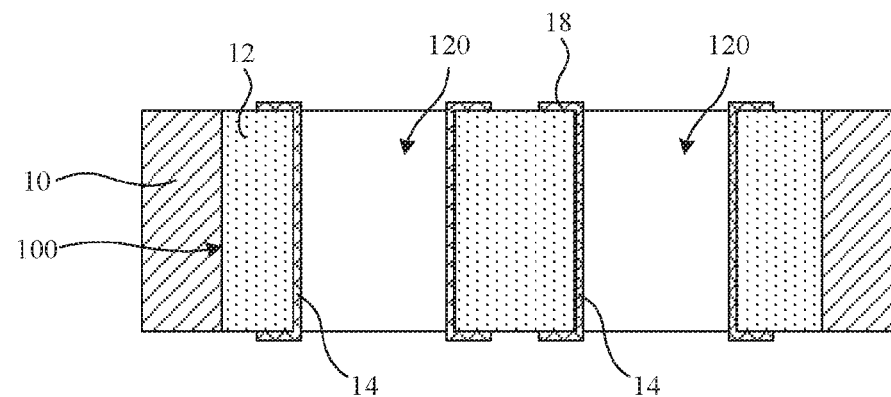

As shown in FIG. 4D, conductors 14 are formed in the vias 120 respectively. The conductors 14 may be formed by, for example, plating conductive metal at least on sidewalls of the vias 120. In some embodiments of the present disclosure, the conductors 14 are made of copper, gold, aluminum, or combinations thereof, but various embodiments of the present disclosure are not limited in this regard. The plating of the conductive metal may be performed by an electroplating process, where an electric current is used to transfer metal in an aqueous solution to a surface of the interconnect structure 1 including the sidewalls of the vias 120. In order to facilitate the electroplating of the conductive metal, a seed layer (not shown) may be deposited prior to the electroplating of the conductive metal. The seed layer provides nucleation sites where the electroplated metal is initially formed. The electroplated metal is deposited more uniformly on the seed layer than on a bare dielectric. Then, the conductive metal is patterned to form the conductors 14. Specifically, the conductive metal may be patterned by, for example, a photolithography and etching process.

In some embodiments of the present disclosure, as shown in FIGS. 1 and 4D, two conductive lines 18 can be formed on the substrate 10 with the conductors 14. The conductive lines 18 are present on the substrate 10 and are respectively electrically connected to the conductors 14 in the vias 120. In practical applications, the conductive lines 18 can transmit high frequency signals. That is, the conductive lines 18 can be high frequency differential pairs transmission lines meeting high frequency (greater than about 20 GHz) transmission line requirements.

In some embodiments of the present disclosure, the conductive lines 18 are redistribution layers (RDL). A RDL is an extra conductive layer on an integrated circuit (IC) chip that makes input/output (I/O) pads of the IC chip available in other locations. When an IC chip is manufactured, the IC chip has a set of I/O pads that are wire-bonded to the pins of the package. A RDL is an extra layer of wiring on the IC chip that enables to be bonded out from different locations on the IC chip.

Figure 4E:
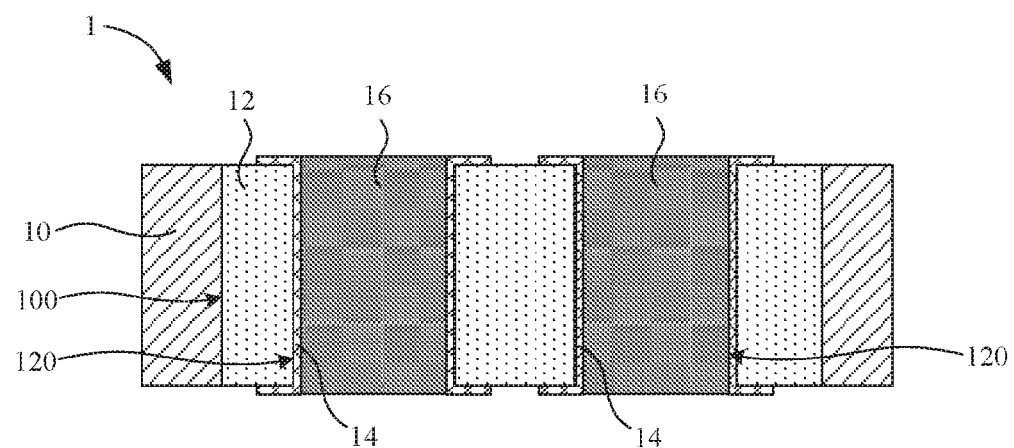

As shown in FIG. 4E, plugs 16 are formed in the remaining vias 120 respectively. The plugs 16 may be formed in the remaining vias 120 by, for example, screen printing or roller printing. In some other embodiments of the present disclosure, the plugs 16 may be made from a photosensitive material. The photosensitive material is filled into the vias 120 and then is exposed to intense light, such as ultraviolet (UV) light, to solidify the photosensitive material. Then, the excess photosensitive material out of the vias 120 may be removed by, for example, a grinding process.

The low-k dielectric block 12 separating the conductors 14 reduces parasitic capacitance between the conductors 14, enabling faster switching speeds and lower electronic crosstalk. That is, the low-k dielectric block 12 can enhance signal isolation between the conductors 14. Therefore, multiple concurrent channels are available in one trace. Furthermore, the method for manufacturing the interconnect structure 1 shown in FIGS. 4A-4E is cost effective since the manufacturing method is doable by existing tools. Moreover, the interconnect structure 1 shown in FIG. 1 does not change integrated circuit (IC) substrates and/or printed circuit board design rules, and the thicknesses and structures of the integrated circuit (IC) substrate and/or the printed circuit board will not be changed by applying the interconnect structure 1 of FIG. 1.

In addition, for a lossless transmission line, the expression for the intrinsic impedance of the transmission line is:

$$Z_C = \sqrt{\frac{L_l}{C_l}} \quad (1)$$

in which $Z_C$ is the intrinsic impedance of the transmission line, $L_1$ is the linear inductance per unit length, and $C_1$ is the linear capacitance per unit length.

The low-k dielectric block 12 can lower the capacitance of the conductive lines 18. According to the above equation (1), the lower capacitance of the conductive lines 18 results in higher intrinsic impedance, which benefits to provide matching impedance when a spacing between the conductive lines 18 is narrow.

Figure 5:
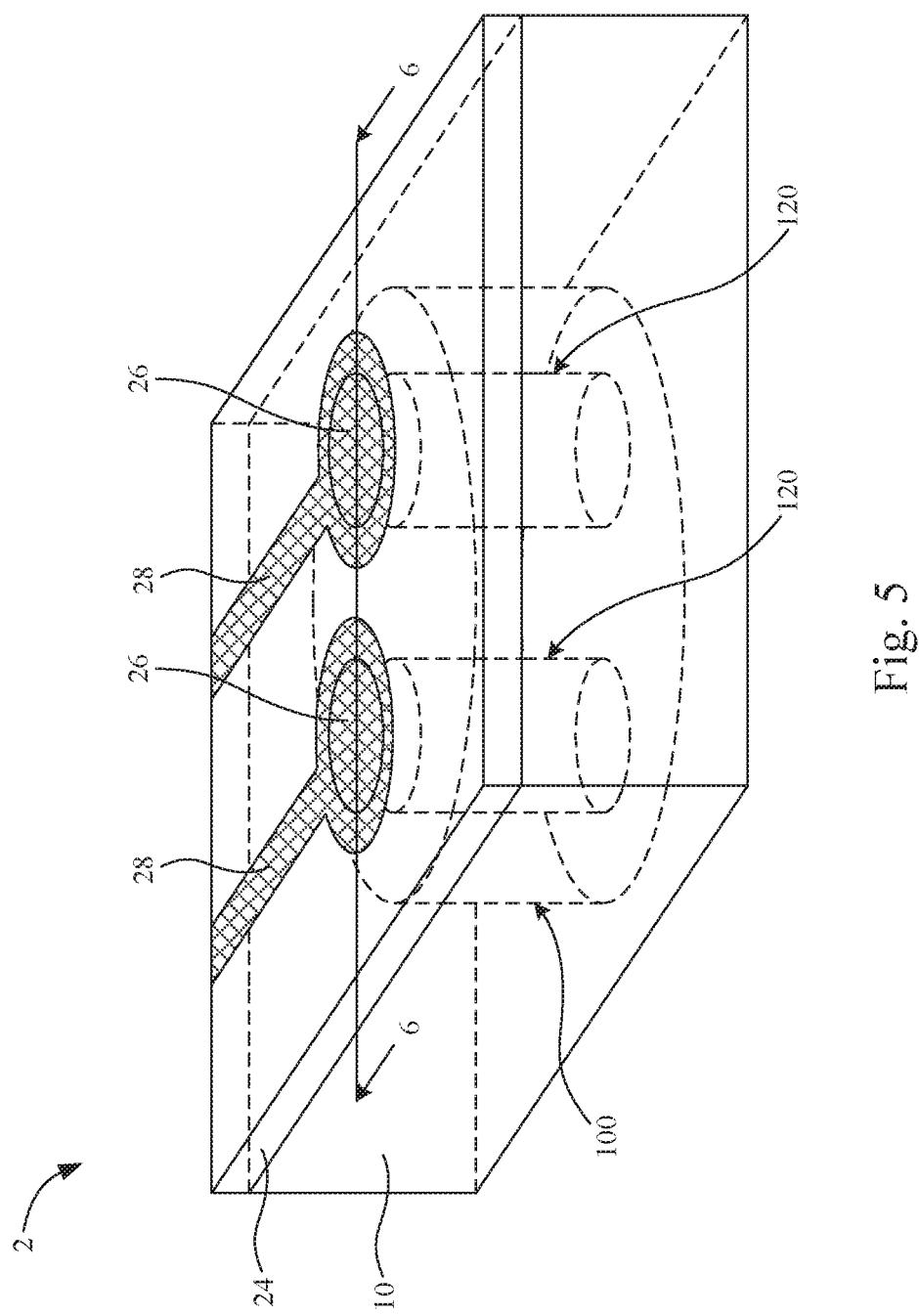
FIG. 5 is a perspective view of an interconnect structure with a differential pair design according to some other embodiments of the present disclosure.
Figure 6:
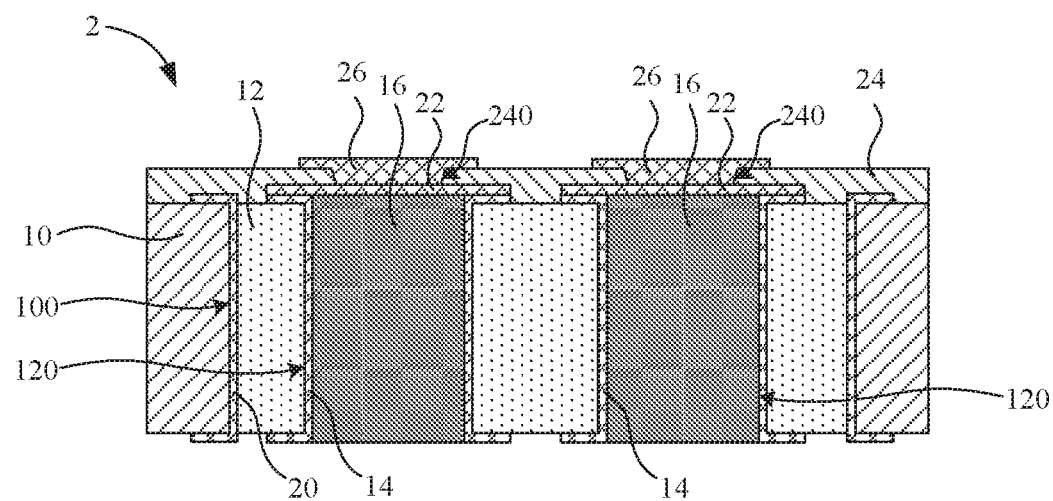
FIG. 6 is a cross-sectional view of the interconnect structure of FIG. 5 taken along line 6 according to some embodiments of the present disclosure.

Reference is made to FIGS. 5 and 6. FIG. 5 is a perspective view of an interconnect structure 2 with a differential pair design according to some other embodiments of the present disclosure. FIG. 6 is a cross-sectional view of the interconnect structure 2 of FIG. 5 taken along line 6 according to some embodiments of the present disclosure. As shown in FIGS. 5-6, the interconnect structure 2 includes a substrate 10, a dielectric block 12, two conductors 14, two plugs 16, a shielding element 20, pads 22, a dielectric layer 24, two conductors 26, and two conductive lines 28. The substrate 10 has an opening 100 therein. The shielding element 20 is present on a sidewall of the opening 100. The dielectric block 12 is then present in the opening 100 of the substrate 10. That is, the shielding element 20 is present between the dielectric block 12 and the sidewall of the opening 100. The dielectric block 12 has two vias 120 therein, in which the dielectric block 12 has a dielectric constant smaller than a dielectric constant of the substrate 10. The conductors 14 are respectively present in the vias 120 of the dielectric block 12. The plugs 16 are respectively plugged in the remaining vias 120. The pads 22 are present on the conductors 14 respectively. The dielectric layer 24 is present on the substrate 10. The dielectric layer 24 has two vias 240 therein to expose the pads 22 respectively. The conductors 26 are present in the vias 240 and electrically connected to the conductors 14 through the pads 22, respectively. The conductive lines 28 are present on a surface of the dielectric layer 24 and electrically connected to the conductors 26, respectively.

Figure 7:
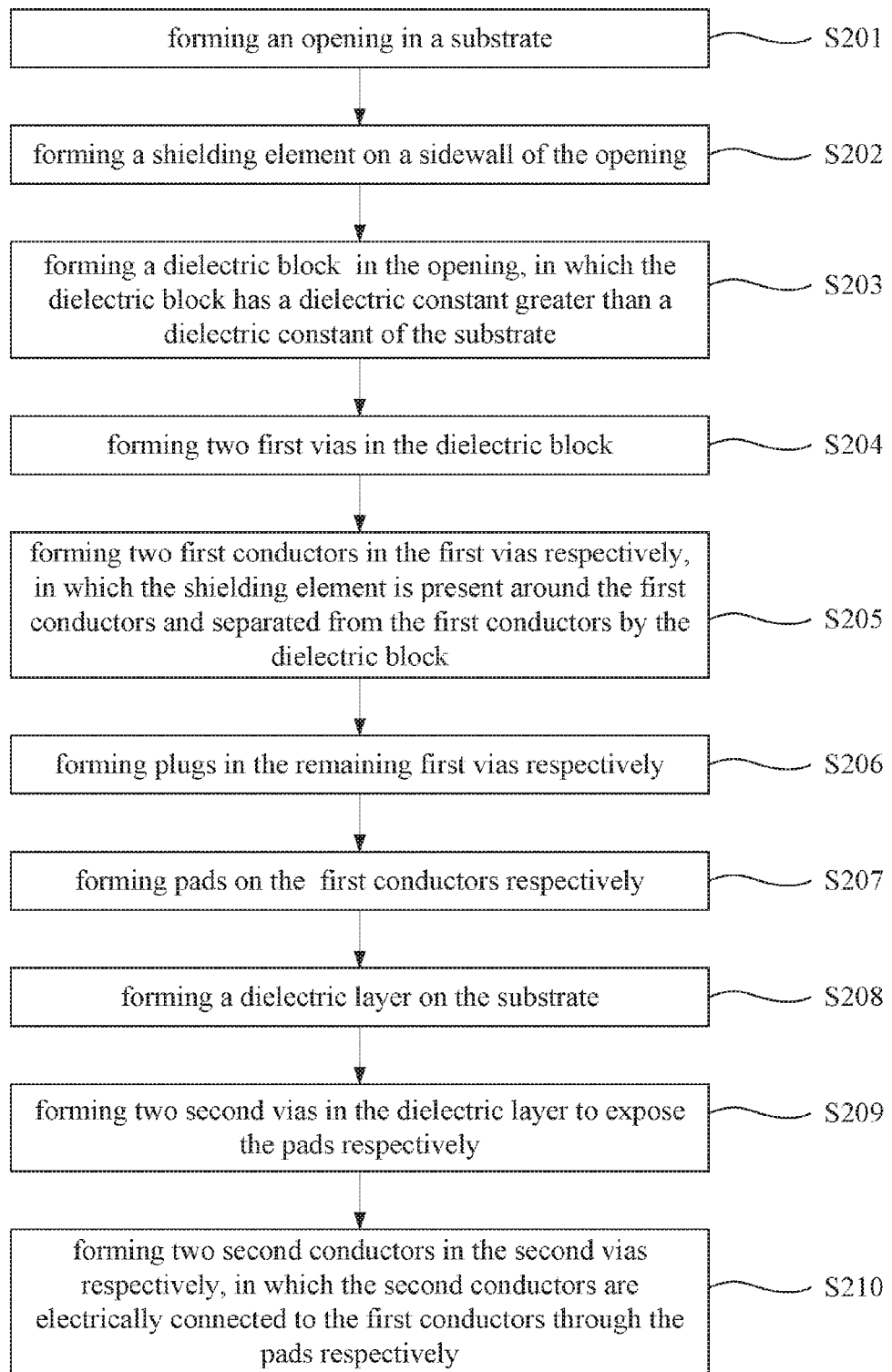
FIG. 7 is a flowchart of a method for manufacturing the interconnect structure of FIG. 5 according to some embodiments of the present disclosure.

Reference is made to FIG. 7. FIG. 7 is a flowchart of a method for manufacturing the interconnect structure of FIG. 5 according to some embodiments of the present disclosure. The method begins with operation S201 in which an opening is formed in a substrate. The method continues with operation S202 in which a shielding element is formed on a sidewall of the opening. The method continues with operation S203 in which a dielectric block is formed in the opening, and the dielectric block has a dielectric constant smaller than a dielectric constant of the substrate. The method continues with operation S204 in which two first vias are formed in the dielectric block. The method continues with operation S205 in which two first conductors are formed in the first vias respectively, and the shielding element is present around the first conductors and separated from the first conductors by the dielectric block. The method continues with operation S206 in which plugs are formed in the remaining first vias respectively. The method continues with operation S207 in which pads are formed on the first conductors respectively. The method continues with operation S208 in which a dielectric layer is formed on the substrate. The method continues with operation S209 in which two second vias are formed in the dielectric layer to expose the pads respectively. The method continues with operation S210 in which two second conductors are formed in the second vias respectively, and the second conductors are electrically connected to the first conductors through the pads respectively.

FIGS. 8A-8I are cross-sectional views taken along line 6 of FIG. 5 to sequentially illustrate steps for manufacturing the interconnect structure 2 according to some embodiments of the present disclosure.

Figure 8A:
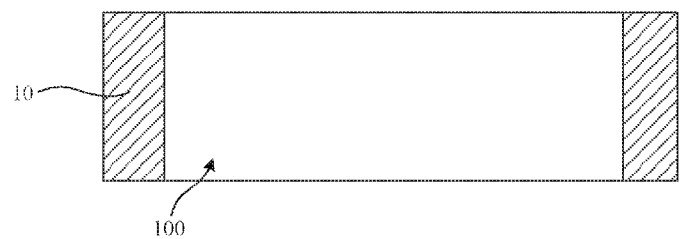
FIGS. 8A-8I are cross-sectional views taken along line 6 of FIG. 5 to sequentially illustrate steps for manufacturing the interconnect structure according to some embodiments of the present disclosure.

Reference is made to FIG. 8A. Similar to FIG. 4A, an opening 100 is formed in a substrate 10. In some embodiments of the present disclosure, the opening 100 is formed by mechanical drilling, mechanical routing, or combinations thereof when the substrate 10 is an integrated circuit (IC) substrate or a printed circuit board (PCB). In some other embodiments, the opening 100 is formed by laser drilling when the substrate 10 is an IC substrate, a PCB, or a dielectric layer. Although the opening 100 shown in FIG. 8A is a through hole, but various embodiments of the present disclosure are not limited in this regard. In some other embodiments, the opening 100 may be a blind hole as well. In yet some other embodiments of the present disclosure, the substrate 10 may be made of a photosensitive dielectric material. The opening 100 may be formed by a photolithography process when the substrate 10 is made of a photosensitive dielectric material.

Figure 8B:
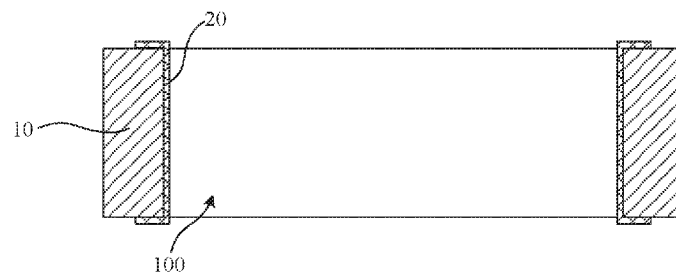

Reference is made to FIG. 8B. As shown in FIG. 8B, a shielding element 20 is formed on a sidewall of the opening 100. In some embodiments, the shielding element 20 may be formed by, for example, plating a conductive metal in the opening 100. The shielding element 20 may be made of copper, gold, aluminum, or combinations thereof, but various embodiments of the present disclosure are not limited in this regard.

Figure 8C:
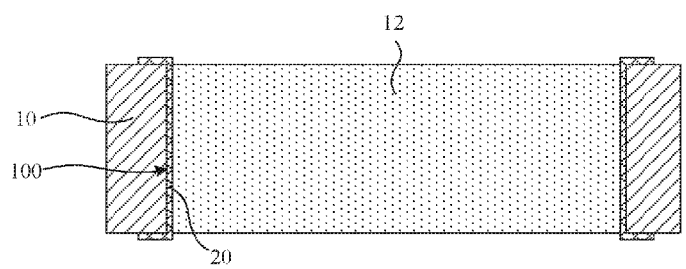

Reference is made to FIG. 8C. Similar to FIG. 4B, a dielectric block 12 is formed in the opening 100 of the substrate 10 by, for example, plugging the dielectric block 12 into the opening 100 of the substrate 10. In some embodiments of the present disclosure, after the dielectric block 12 is formed in the opening 100, the excess dielectric block 12 out of the opening 100 is removed by, for example, a grinding process. Therefore, after the dielectric block 12 is ground, the dielectric block 12 is substantially level with a top surface of the substrate 10.

Figure 8D:
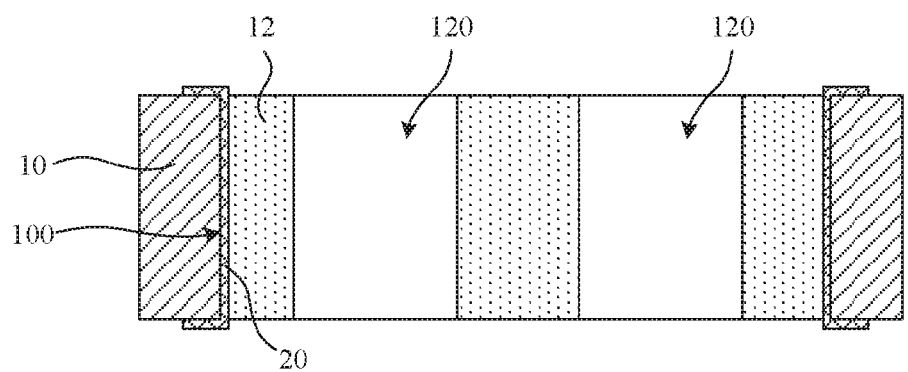

Reference is made to FIG. 8D. Similar to FIG. 4C, vias 120 are formed in the dielectric block 12. In some embodiments of the present disclosure, the vias 120 are formed by mechanical drilling, mechanical routing, or combinations thereof, but various embodiments of the present disclosure are not limited in this regard. For example, in some other embodiments of the present disclosure, the vias 120 can be formed by laser drilling. In yet some other embodiments of the present disclosure, the dielectric block 12 may be made of a photosensitive low-k material. The vias 120 may be formed by a photolithography process when the dielectric block 12 is made of a photosensitive low-k material.

Figure 8E:
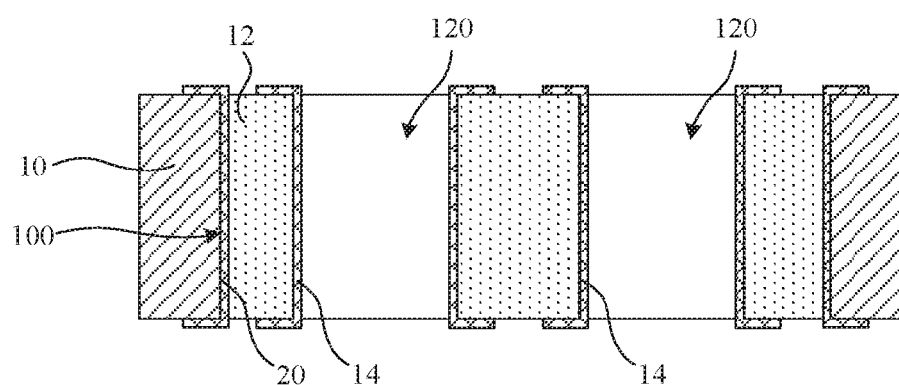

Reference is made to FIG. 8E. Similar to FIG. 4D, conductors 14 are formed in the vias 120 respectively. The conductors 14 may be formed by, for example, plating conductive metal at least on sidewalls of the vias 120. The plating of the conductive metal may be performed by an electroplating process. In order to facilitate the electroplating of the conductive metal, a seed layer (not shown) may be deposited prior to the electroplating of the conductive metal. Then, the conductive metal is patterned to form the conductors 14. Specifically, the conductive metal may be patterned by, for example, a photolithography and etching process.

Figure 8F:
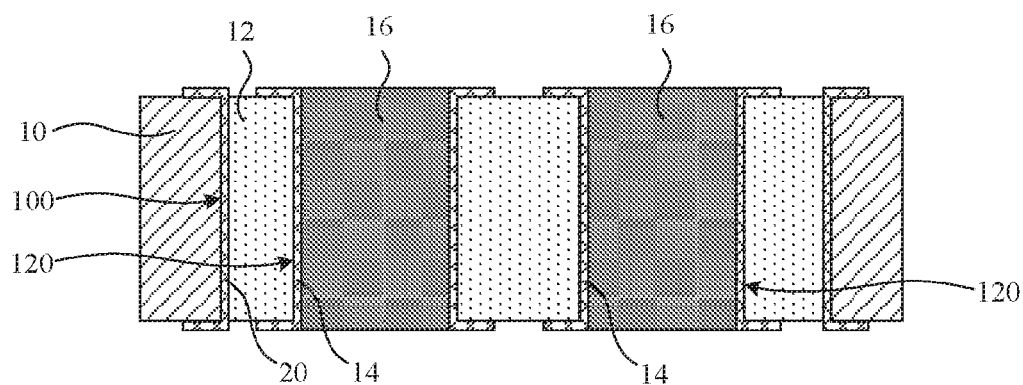

Reference is made to FIG. 8F. Similar to FIG. 4E, plugs 16 are formed in the remaining vias 120 respectively. The plugs 16 may be formed in the remaining vias 120 by, for example, screen printing or roller printing. In some other embodiments of the present disclosure, the plugs 16 may be made from a photosensitive material. The photosensitive material is filled into the vias 120 and then is exposed to intense light, such as ultraviolet (UV) light, to solidify the photosensitive material. Then, the excess photosensitive material out of the vias 120 may be removed by, for example, a grinding process.

Figure 8G:
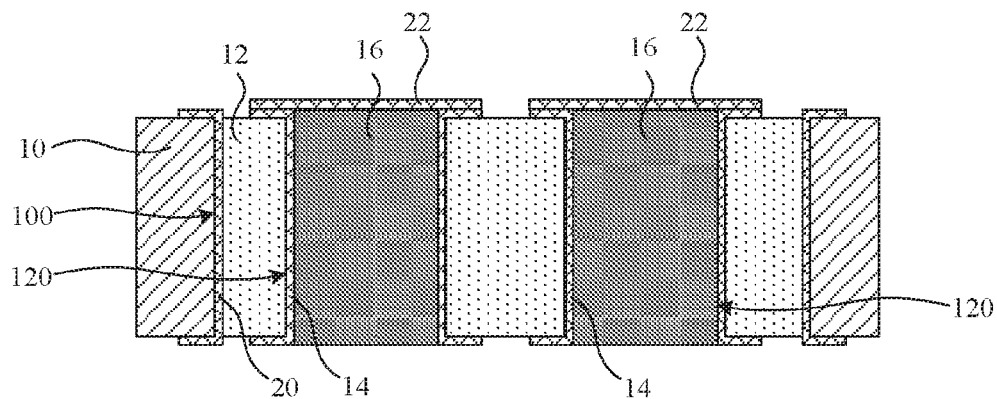

Reference is made to FIG. 8G. As shown in FIG. 8G, pads 20 are formed on the conductors 14 respectively. In some embodiments, the pads 22 are made of a metal (e.g., Cu). In some embodiments, the pads 22 may be formed by, for example, depositing, but various embodiments of the present disclosure are not limited in this regard. In some other embodiments, the pads 22 are made of graphite powder.

Figure 8H:
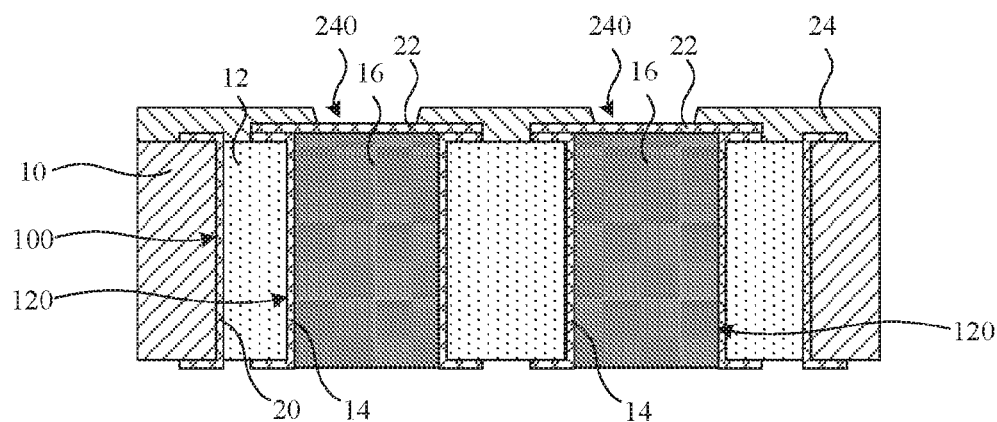

Reference is made to FIG. 8H. As shown in FIG. 8H, a dielectric layer 24 is formed on the substrate 10, and vias 240 are formed in the dielectric layer 24. In some embodiments, the dielectric layer 24 is formed on the substrate 10 by, for example, laminating. In some embodiments, the dielectric layer 24 is made of FR-4 glass-reinforced epoxy, polyimide, benzocyclobutene (BCB), a photosensitive dielectric material, or combinations thereof. The dielectric layer 24 is formed by, for example, spin coating. In some embodiments, the vias 240 of the dielectric layer 24 are formed by mechanical drilling, mechanical routing, laser drilling, or combinations thereof, but various embodiments of the present disclosure are not limited in this regard. In yet some other embodiments of the present disclosure, the dielectric layer 24 may be made of a photosensitive material. The vias 240 may be formed by a photolithography process when the dielectric layer 24 is made of a photosensitive material.

Figure 8I:
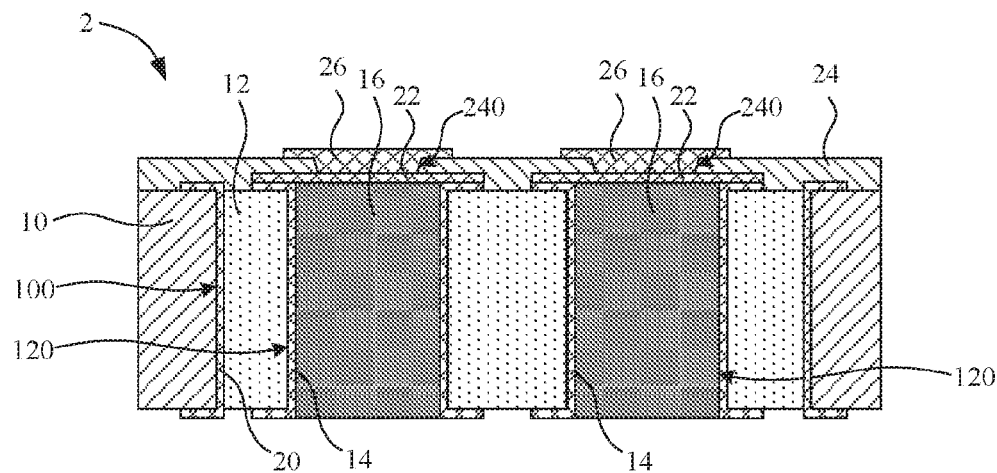

Reference is made to FIG. 8I. As shown in FIG. 8I, conductors 26 are formed in the vias 240 and electrically connected to the conductors 14 through the pads 22 respectively. In some embodiments, the conductors 26 may be formed by, for example, plating a conductive metal in the vias 240. The conductors 26 are made of copper, gold, aluminum, or combinations thereof, but various embodiments of the present disclosure are not limited in this regard. In some embodiments, the vias 240 may be filled with the conductors 26. In some other embodiments, the conductors 26 may be conformally formed on sidewalls of the vias 240 respectively.

In some embodiments, as shown in FIG. 5, two conductive lines 28 can be formed on the dielectric layer 24 with the conductor 26. The conductive lines 28 are present on the dielectric layer 24 and are respectively electrically connected to the conductor 26 in the vias 240. In practical applications, the conductive lines 28 can transmit high frequency signals. That is, the conductive lines 28 can be high frequency differential pairs transmission lines meeting high frequency (greater than about 20 GHz) transmission line requirements. It is noted that since the dielectric block 12 and the conductors 14 therein are surrounded by the shielding element 20, isolation between the conductors 14 and/or between the conductors 14 and other interconnections, e.g. other conductive vias in the substrate 10, can be enhanced, and therefore electromagnetic interference therebetween can be diminished.

Figure 10:
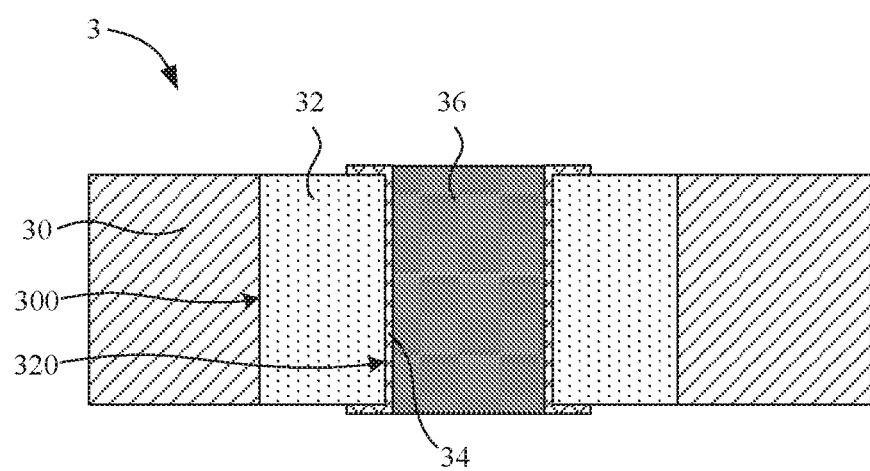
FIG. 10 is a cross-sectional view of the interconnect structure of FIG. 9 taken along line 10 according to some embodiments of the present disclosure.

Reference is made to FIGS. 9 and 10. FIG. 9 is a perspective view of an interconnect structure 3 with a single end design according to some embodiments of the present disclosure. FIG. 10 is a cross-sectional view of the interconnect structure 3 of FIG. 9 taken along line 10 according to some embodiments of the present disclosure. It should be pointed out that single-ended signaling is the opposite technique of differential signaling. In single-ended signaling, the transmitter generates a single voltage that the receiver compares with a fixed reference voltage, both relative to a common ground connection shared by both ends.

As shown in FIGS. 9-10, in some embodiments of the disclosure, the interconnect structure 3 is provided. The interconnect structure 3 includes a substrate 30, a dielectric block 32, a conductor 34, and a conductive line 38. The substrate 30 has an opening 300 therein. The material(s) of the substrate 30 may be similar to that of the substrate 10 of FIG. 1 and therefore are not repeated here to avoid duplicity. The dielectric block 32 is present in the opening 300 of the substrate 30. The dielectric block 32 has one via 320 therein, in which the dielectric block 32 has a dielectric constant smaller than a dielectric constant of the substrate 30. The material(s) of the dielectric block 32 may be similar to that of the dielectric block 12 of FIG. 1 and therefore are not repeated here to avoid duplicity. The conductor 34 is present in the via 320 of the dielectric block 32. Specifically, the conductor 34 is present on a sidewall of the via 320. The conductive line 38 is present on a surface of the substrate 30 and is connected to the conductor 34. The material(s) of the conductor 34 may be similar to that of the conductors 14 of FIG. 2 and therefore are not repeated here to avoid duplicity.

In some embodiments of the disclosure, the interconnect structure 3 further includes a plug 36 plugged in the remaining via 320 to prevent solder from wicking through the via 320 during the assembly process and damaging (short-circuitry adjacent paths) the finished product. In some other embodiments of the present disclosure, the plug 36 may be absent from the via 320. In yet some other embodiments of the present disclosure, the via 320 may be filled with the conductor 34. The material(s) of the plug 36 may be similar to that of the plugs 16 of FIG. 1 and therefore are not repeated here to avoid duplicity.

Figure 11:
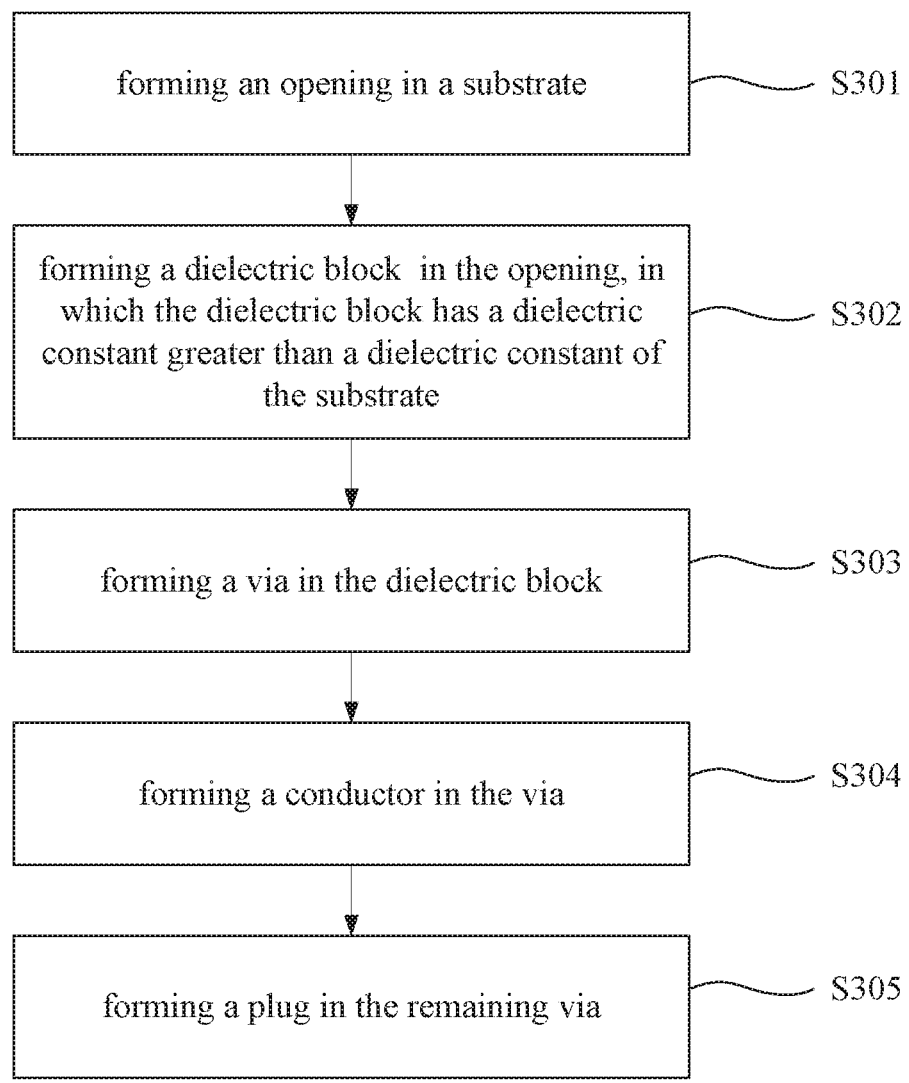
FIG. 11 is a flowchart of a method for manufacturing the interconnect structure of FIG. 9 according to some embodiments of the present disclosure.

Reference is made to FIG. 11. FIG. 11 is a flowchart of a method for manufacturing the interconnect structure of FIG. 9 according to some embodiments of the present disclosure. The method begins with operation S301 in which an opening is formed in a substrate. The method continues with operation S302 in which a dielectric block is formed in the opening, and the dielectric block has a dielectric constant smaller than a dielectric constant of the substrate. The method continues with operation S303 in which a via is formed in the dielectric block. The method continues with operation S304 in which a conductor is formed in the via. The method continues with operation S305 in which a plug is formed in the remaining via.

Figure 12A:
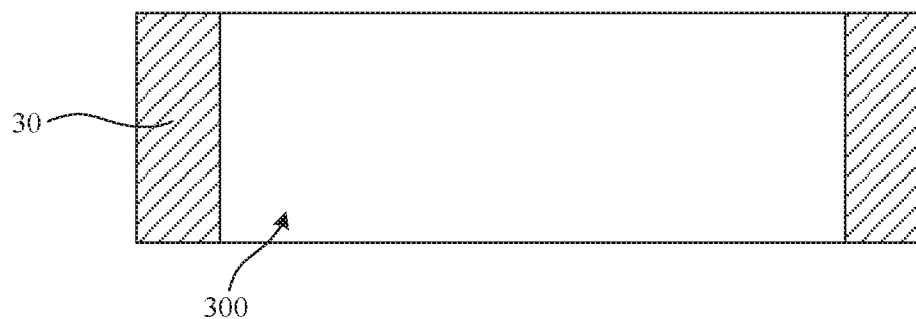
FIGS. 12A-12E are cross-sectional views taken along line 10 of FIG. 9 to sequentially illustrate steps for manufacturing the interconnect structure according to some embodiments of the present disclosure.

Reference is made to FIGS. 12A-12E. FIGS. 12A-12E are cross-sectional views taken along line 10 of FIG. 9 to sequentially illustrate steps for manufacturing the interconnect structure 3 according to some embodiments of the present disclosure. As shown in FIG. 12A, an opening 300 is formed in the substrate 30. In some embodiments of the disclosure, the opening 300 is formed by mechanical drilling, mechanical routing, or combinations thereof when the substrate 30 is an integrated circuit (IC) substrate or a printed circuit board (PCB). In some other embodiments of the present disclosure, the opening 300 is formed by laser drilling when the substrate 30 is an IC substrate, a PCB, or a dielectric layer. Although the opening 300 shown in FIG. 12A is a through hole, but various embodiments of the present disclosure are not limited in this regard. In some other embodiments of the present disclosure, the opening 300 may be a blind hole as well.

Figure 12B:
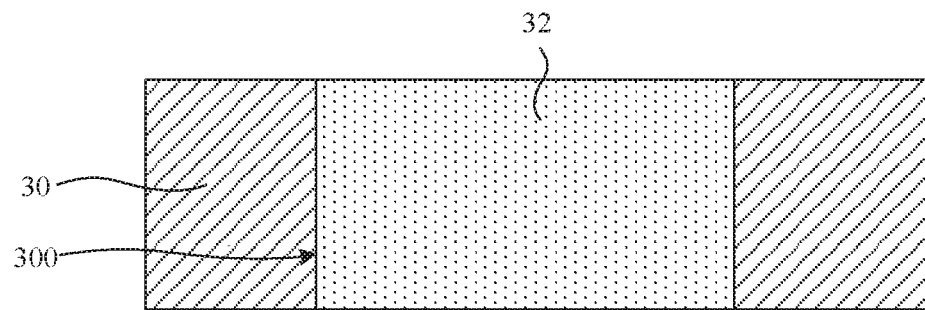

As shown in FIG. 12B, a dielectric block 32 is formed in the opening 300 of the substrate 30 by, for example, plugging the dielectric block 32 into the opening 300 of the substrate 30. In some embodiments of the present disclosure, after the dielectric block 32 is formed in the opening 300, the excess dielectric block 32 out of the opening 300 is removed by, for example, a grinding process. Therefore, after the dielectric block 32 is ground, the dielectric block 32 is substantially level with a top surface of the substrate 30.

Figure 12C:
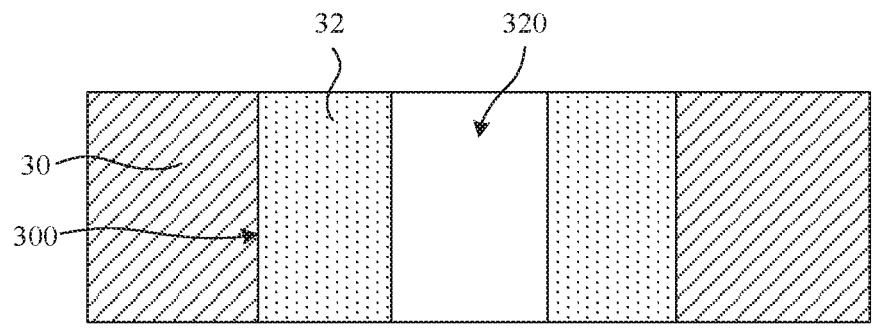

As shown in FIG. 12C, the via 320 is formed in the dielectric block 32. In some embodiments of the disclosure, the via 320 is formed by mechanical drilling, mechanical routing, laser drilling, or combinations thereof, but various embodiments of the present disclosure are not limited in this regard. For example, in some other embodiments of the present disclosure, the via 320 can be formed by laser drilling. In yet some other embodiments of the present disclosure, the dielectric block 32 may be made of a photosensitive low-k material. The via 320 may be formed by a photolithography process when the dielectric block 32 is made of a photosensitive low-k material. Specifically, the dielectric block 32 is exposed to a pattern of intense light. The exposure to light causes a chemical change that allows some of the dielectric block 32 soluble in a photographic developer. Then, the photographic developer is applied onto the dielectric block 32 to remove the some of the dielectric block 32 soluble in the photographic developer to form the via 320 in the dielectric block 32.

Figure 12D:
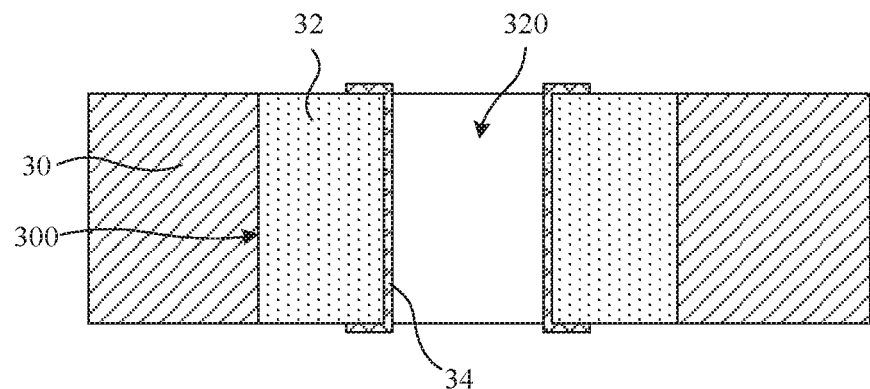

As shown in FIG. 12D, conductor 34 is formed in the via 320. The conductor 34 may be formed by, for example, plating a conductive metal at least on a sidewall of the via 320. In some embodiments of the present disclosure, the conductor 34 is made of copper, gold, aluminum, or combinations thereof, but various embodiments of the present disclosure are not limited in this regard. The plating of the conductive metal may be performed by an electroplating process, where an electric current is used to transfer metal in an aqueous solution to a surface of the interconnect structure 3 including the sidewall of the via 320. In order to facilitate the electroplating of the conductive metal, a seed layer (not shown) may be deposited prior to the electroplating of the conductive metal. The seed layer provides nucleation sites where the electroplated metal is initially formed. The electroplated metal deposits more uniformly on the seed layer than on a bare dielectric. Then, the conductive metal is patterned to form the conductor 34. Specifically, the conductive metal may be patterned by, for example, a photolithography and etching process.

In some embodiments of the present disclosure, as shown in FIGS. 9 and 12D, the conductive line 38 can be formed on the substrate 30 with the conductor 34. The conductive line 38 is present on the substrate 30 and is respectively electrically connected to the conductor 34 in the via 320. In practical applications, the conductive line 38 can transmit high frequency signals. That is, the conductive line 38 can be high frequency differential pairs transmission lines meeting high frequency (greater than about 20 GHz) transmission line requirements.

Figure 12E:
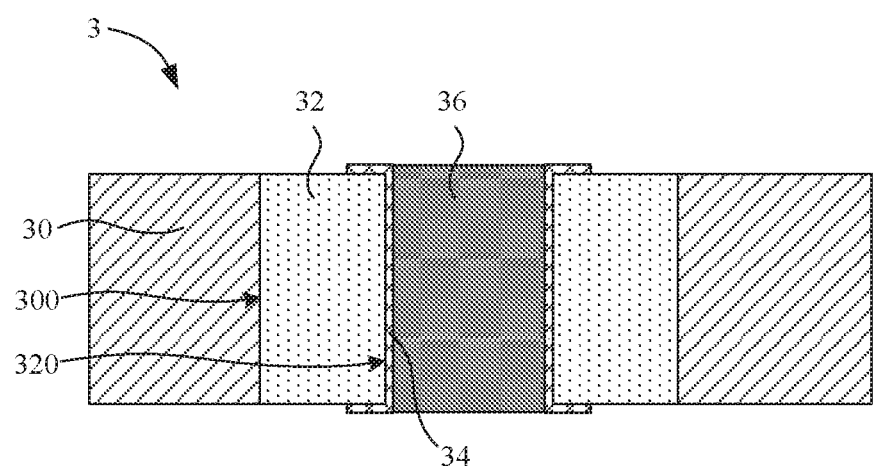

As shown in FIG. 12E, a plug 36 is formed in the remaining via 320. The plug 36 may be formed in the remaining via 320 by, for example, screen printing or roller printing. In some other embodiments of the present disclosure, the plug 36 may be made from a photosensitive material. The photosensitive material is filled into the via 320 and then is exposed to intense light, such as ultraviolet (UV) light, to solidify the photosensitive material. Then, the excess photosensitive material out the via 320 may be removed by, for example, a grinding process.

In some embodiments of the present disclosure, in operation S304 in FIG. 11, a conductive line 38 can be simultaneously formed on the substrate 30 with the conductor 34. As shown in FIGS. 9-10, in some embodiments of the present disclosure, the interconnect structure 3 further includes a conductive line 38. The conductive line 38 is present on the substrate 30 and electrically connected to the conductor 34 in the via 320.

The low-k dielectric block 32 separating the conductor 34 and other interconnections (e.g., other conductive vias in the substrate 30) reduces parasitic capacitance between the conductor 34 and the interconnections, enabling faster switching speeds and lower electronic crosstalk. The method for manufacturing the interconnect structure 3 shown in FIGS. 12A-12E is cost effective since the manufacturing method is doable by existing tools. The interconnect structure 3 shown in FIG. 9 does not change integrated circuit (IC) substrate and/or printed circuit board design rules and the thicknesses and structures of the integrated circuit (IC) substrate and/or the printed circuit board will not be changed by applying the interconnect structure 3 of FIG. 9.

Figure 13:
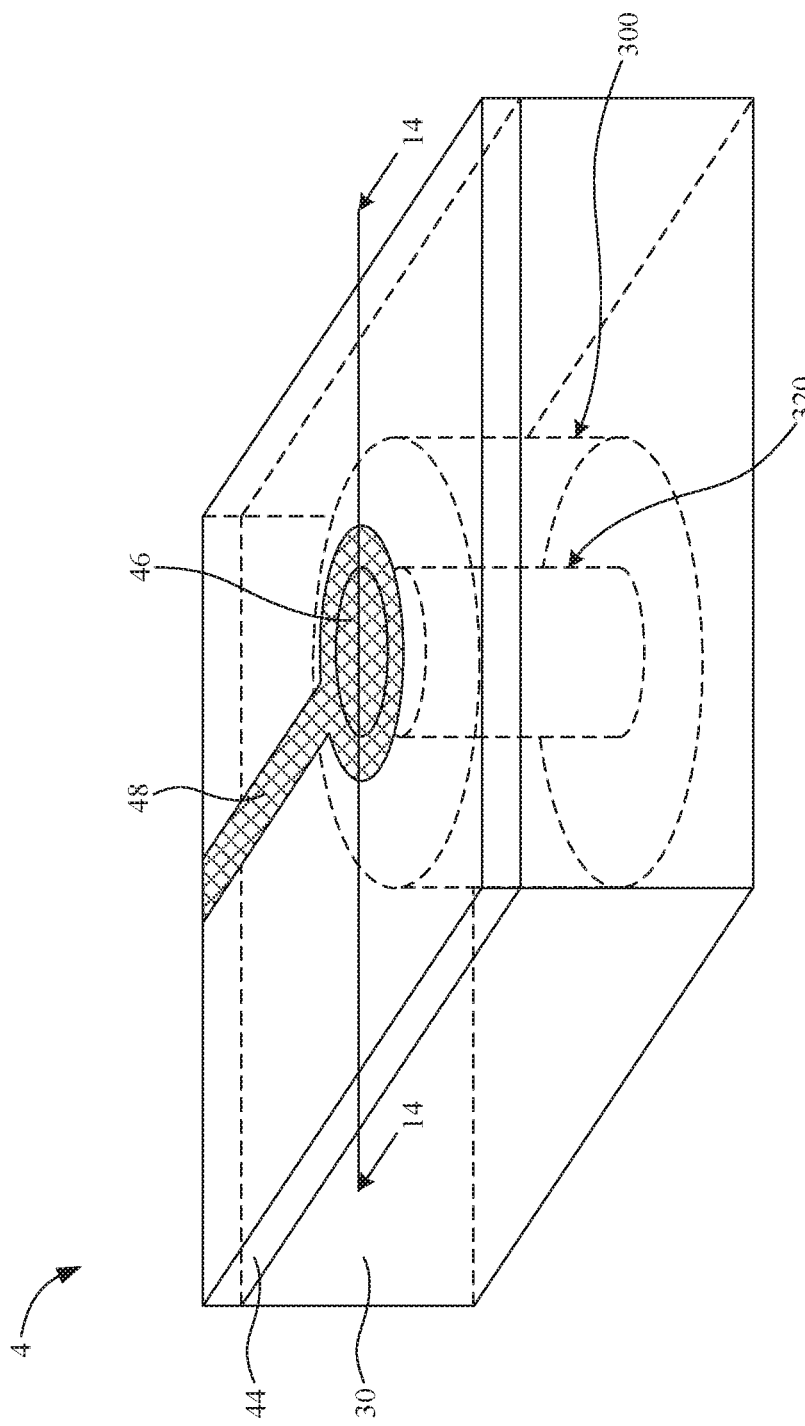
FIG. 13 is a perspective view of an interconnect structure with a single end design according to some other embodiments of the present disclosure.
Figure 14:
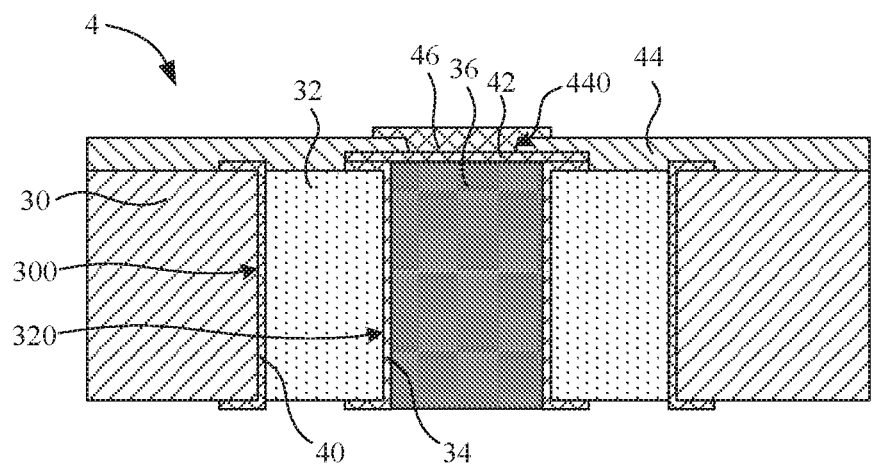
FIG. 14 is a cross-sectional view of the interconnect structure of FIG. 13 taken along line 14 according to some embodiments of the present disclosure.

Reference is made to FIGS. 13-14. FIG. 13 is a perspective view of an interconnect structure 4 with a single end design according to some other embodiments of the present disclosure. FIG. 14 is a cross-sectional view of the interconnect structure 4 of FIG. 13 taken along line 14 according to some embodiments of the present disclosure. As shown in FIGS. 13-14, the interconnect structure 3 includes a substrate 30, a dielectric block 32, a conductor 34, a plug 36, a shielding element 40, a pad 42, a dielectric layer 44, a conductor 46, and a conductive line 48. The substrate 30 has an opening 300 therein. The shielding element 40 is present on a sidewall of the opening 300. The dielectric block 32 is present in the opening 300 of the substrate 30. That is, shielding element 40 is present between the dielectric block 32 and the sidewall of the opening 300. The dielectric block 32 has one via 320 therein, in which the dielectric block 32 has a dielectric constant smaller than a dielectric constant of the substrate 30. The conductor 34 is present in the via 320 of the dielectric block 32. The plug 36 is plugged in the remaining via 320. The pad 44 is present on the conductor 36. The dielectric layer 44 is present on the substrate 30. The dielectric layer 44 has a via 440 therein to expose the pad 42. The conductor 46 is present in the via 440 and electrically connected to the conductor 34 through the pad 42. The conductive line 48 is present on a surface of the dielectric layer 44 and electrically connected to the conductor 46.

Figure 15:
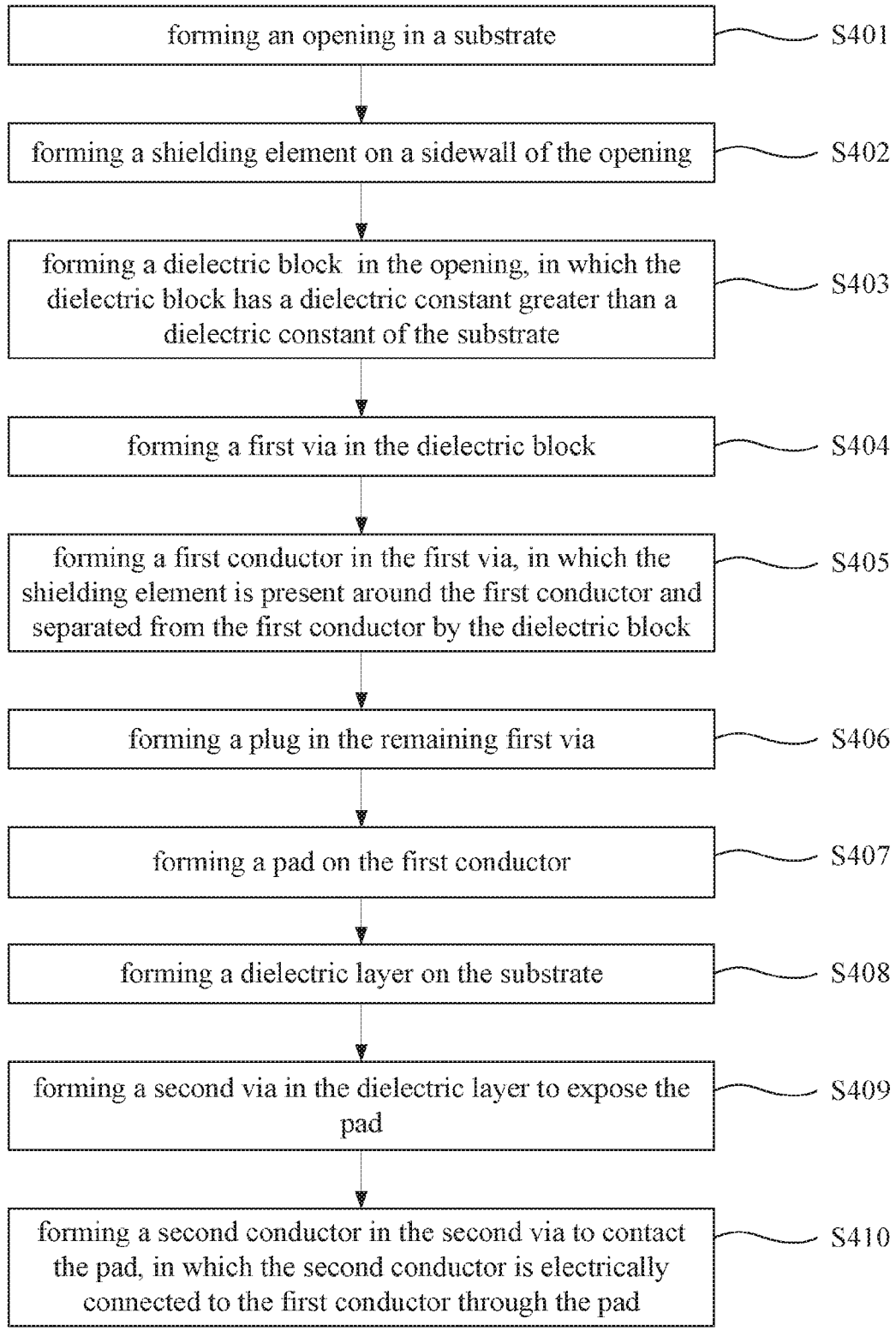
FIG. 15 is a flowchart of a method for manufacturing the interconnect structure of FIG. 13 according to some embodiments of the present disclosure.

Reference is made to FIG. 15. FIG. 15 is a flowchart of a method for manufacturing the interconnect structure of FIG. 13 according to some embodiments of the present disclosure. The method begins with operation S401 in which an opening is formed in a substrate. The method continues with operation S402 in which a shielding element is formed on a sidewall of the opening. The method continues with operation S403 in which a dielectric block is formed in the opening, and the dielectric block has a dielectric constant smaller than a dielectric constant of the substrate. The method continues with operation S404 in which a first via is formed in the dielectric block. The method continues with operation S405 in which a first conductor is formed in the first via, and the shielding element is present around the conductor and separated from the conductor by the dielectric block. The method continues with operation S406 in which a plug is formed in the remaining first via. The method continues with operation S407 in which a pad is formed on the first conductor. The method continues with operation S408 in which a dielectric layer is formed on the substrate. The method continues with operation S409 in which a second via is formed in the dielectric layer to expose the pad. The method continues with operation S410 in which a second conductor is formed in the second via and electrically connected to the first conductor through the pad.

FIGS. 16A-16I are cross-sectional views taken along line 14 of FIG. 13 to sequentially illustrate steps for manufacturing the interconnect structure 4 according to some embodiments of the present disclosure.

Figure 16A:
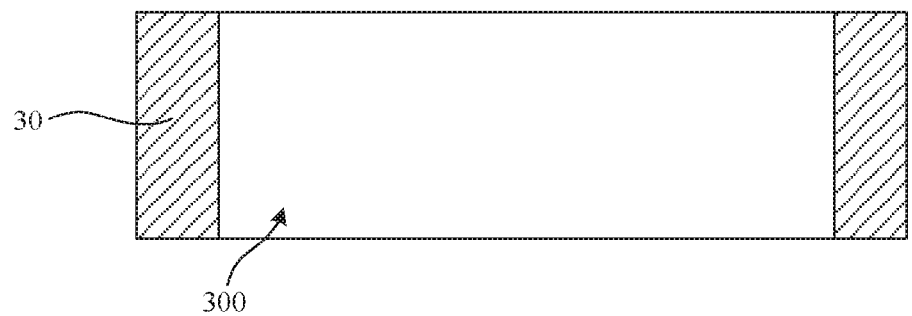
FIGS. 16A-16I are cross-sectional views taken along line 14 of FIG. 13 to sequentially illustrate steps for manufacturing the interconnect structure according to some embodiments of the present disclosure.

Reference is made to FIG. 16A. Similar to FIG. 12A, an opening 300 is formed in a substrate 30. In some embodiments of the present disclosure, the opening 300 is formed by mechanical drilling, mechanical routing, or combinations thereof when the substrate 30 is an integrated circuit (IC) substrate or a printed circuit board (PCB). In some other embodiments, the opening 300 is formed by laser drilling when the substrate 30 is an IC substrate, a PCB, or a dielectric layer. Although the opening 300 shown in FIG. 16A is a through hole, but various embodiments of the present disclosure are not limited in this regard. In some other embodiments, the opening 300 may be a blind hole as well. In yet some other embodiments of the present disclosure, the substrate 30 may be made of a photosensitive dielectric material. The opening 300 may be formed by a photolithography process when the substrate 30 is made of a photosensitive dielectric material.

Figure 16B:
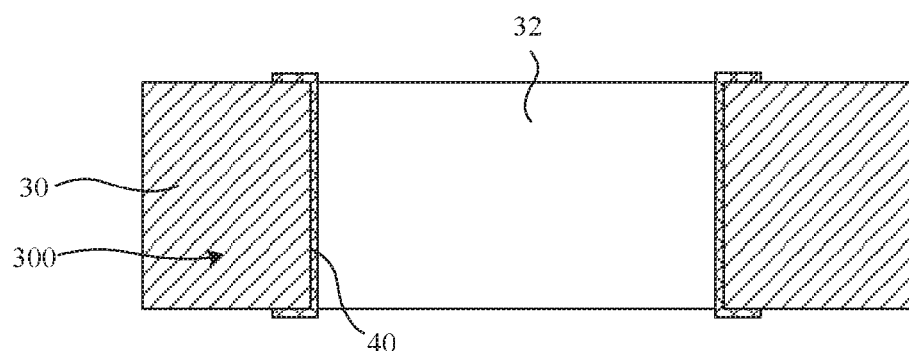

Reference is made to FIG. 16B. As shown in FIG. 16B, a shielding element 40 is formed on a sidewall of the opening 300. In some embodiments, the shielding element 40 may be formed by, for example, plating a conductive metal in the opening 300. The shielding element 40 may be made of copper, gold, aluminum, or combinations thereof, but various embodiments of the present disclosure are not limited in this regard.

Figure 16C:
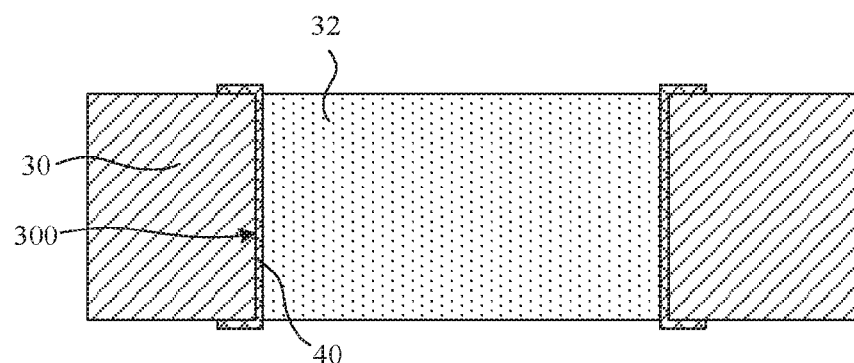

Reference is made to FIG. 16C. Similar to FIG. 12B, a dielectric block 32 is formed in the opening 300 of the substrate 30 by, for example, plugging the dielectric block 32 into the opening 300 of the substrate 30. In some embodiments of the present disclosure, after the dielectric block 32 is formed in the opening 300, the excess dielectric block 32 out of the opening 300 is removed by, for example, a grinding process. Therefore, after the dielectric block 32 is ground, the dielectric block 32 is substantially level with a top surface of the substrate 30.

Figure 16D:
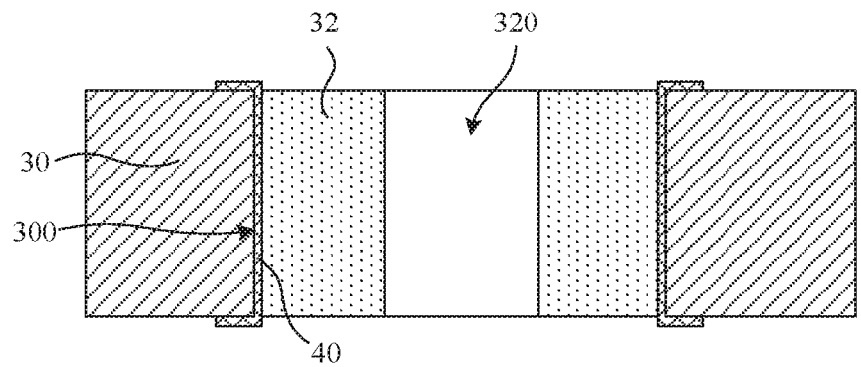

Reference is made to FIG. 16D. As shown in FIG. 16D, a via 320 is formed in the dielectric block 32. Similar to FIG. 12C, a via 320 is formed in the dielectric block 32. In some embodiments of the present disclosure, the via 320 is formed by mechanical drilling, mechanical routing, or combinations thereof, but various embodiments of the present disclosure are not limited in this regard. For example, in some other embodiments of the present disclosure, the via 320 can be formed by laser drilling. In yet some other embodiments of the present disclosure, the dielectric block 32 may be made of a photosensitive low-k material. The via 320 may be formed by a photolithography process when the dielectric block 32 is made of a photosensitive low-k material.

Figure 16E:
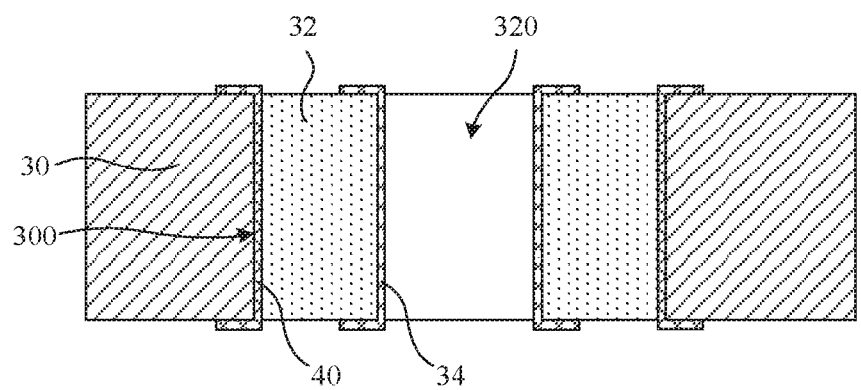

Reference is made to FIG. 16E. Similar to FIG. 12D, a conductor 34 is formed in the via 320. The conductor 34 may be formed by, for example, plating conductive metal at least on a sidewall of the via 320. The plating of the conductive metal may be performed by an electroplating process. In order to facilitate the electroplating of the conductive metal, a seed layer (not shown) may be deposited prior to the electroplating of the conductive metal. Then, the conductive metal is patterned to form the conductor 34. Specifically, the conductive metal may be patterned by, for example, a photolithography and etching process.

Figure 16F:
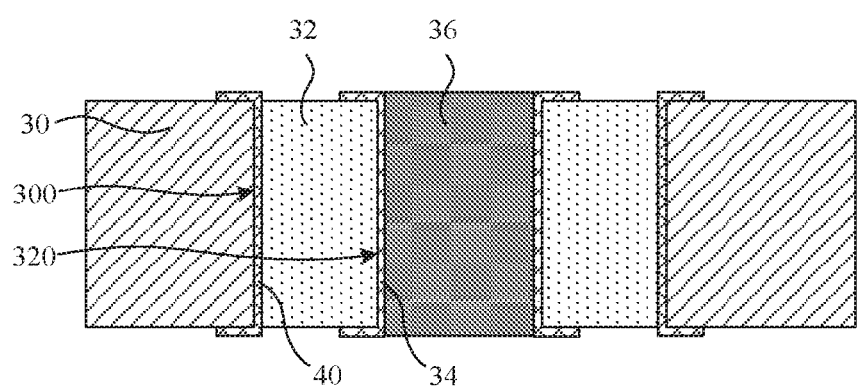

Reference is made to FIG. 16F. Similar to FIG. 12E, a plug 36 is formed in the remaining via 320. The plug 36 may be formed in the remaining via 320 by, for example, screen printing or roller printing. In some other embodiments of the present disclosure, the plug 36 may be made from a photosensitive material. The photosensitive material is filled into the via 320 and then is exposed to intense light, such as ultraviolet (UV) light, to solidify the photosensitive material. Then, the excess photosensitive material out of the via 320 may be removed by, for example, a grinding process.

Figure 16G:
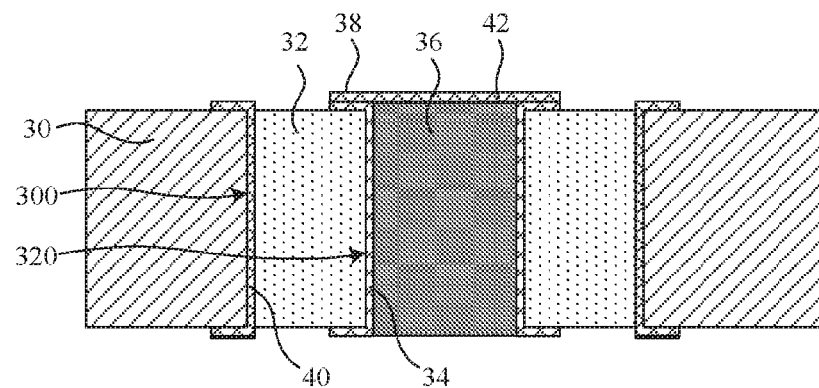

Reference is made to FIG. 16G. As shown in FIG. 16G, a pad 42 is formed on the conductor 34. In some embodiments, the pad 42 is made of a metal (e.g., Cu). In some embodiments, the pad 42 may be formed by, for example, depositing, but various embodiments of the present disclosure are not limited in this regard. In some other embodiments, the pad 42 is made of graphite powder.

Figure 16H:
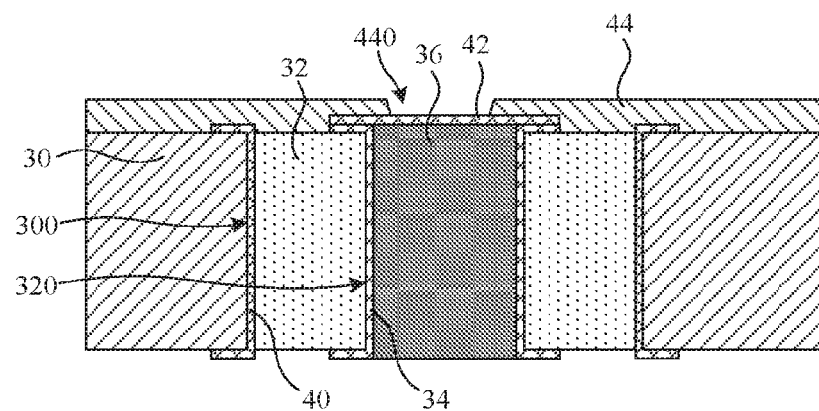

Reference is made to FIG. 16H. As shown in FIG. 16H, a dielectric layer 44 is formed on the substrate 30, and a via 440 is formed in the dielectric layer 44. In some embodiments, the dielectric layer 44 is formed on the substrate 30 by, for example, laminating. In some embodiments, the dielectric layer 44 is formed by, for example, spin coating. In some embodiments, the via 440 of the dielectric layer 44 is formed by mechanical drilling, mechanical routing, laser drilling, or combinations thereof, but various embodiments of the present disclosure are not limited in this regard. In yet some other embodiments of the present disclosure, the dielectric layer 44 may be made of a photosensitive material. The via 440 may be formed by a photolithography process when the dielectric layer 44 is made of a photosensitive material.

Figure 16I:
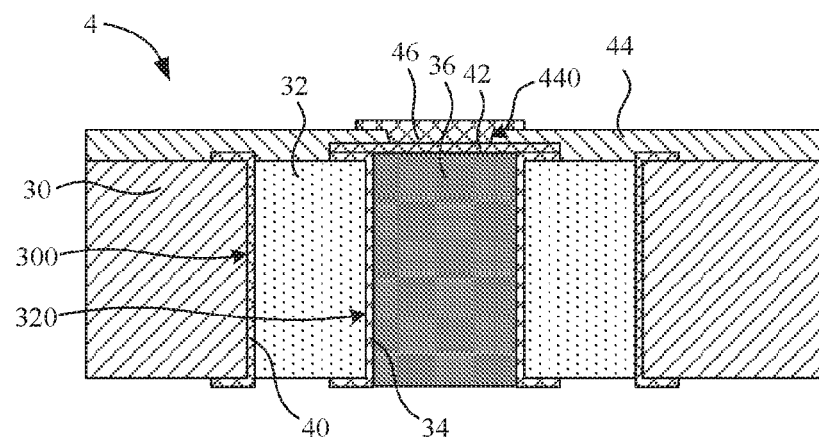

Reference is made to FIG. 16I. As shown in FIG. 16I, a conductor 46 is formed in the via 440 to contact the pad 42. In some embodiments, the conductor 46 may be formed by, for example, plating a conductive metal in the via 440. In some embodiments, the via 440 may be filled with the conductor 46. In some other embodiments, the conductor 46 may be conformally formed on sidewalls of the via 440 respectively.

In some embodiments, as shown in FIG. 13, a conductive line 48 can be formed on the dielectric layer 44 with the conductor 46. The conductive line 48 is present on the dielectric layer 44 and is electrically connected to the conductor 46 in the vias 440. In practical applications, the conductive lines 48 can transmit high frequency signals. That is, the conductive lines 48 can be high frequency differential pairs transmission lines meeting high frequency (greater than about 20 GHz) transmission line requirements. It is noted that since the dielectric block 32 and the conductor 34 therein are surrounded by the shielding element 40, isolation between the conductor 34 and other interconnections, e.g. other conductive vias in the substrate 30, can be enhanced, and therefore electromagnetic interference therebetween can be diminished.

According to some embodiments, a method for manufacturing an interconnect structure is provided. The method includes: forming an opening in a substrate; forming a low-k dielectric block in the opening; forming at least one first via in the low-k dielectric block; and forming a first conductor in the first via.

According to some embodiments, an interconnect structure is provided. The interconnect structure includes a substrate, a dielectric block, and a first conductor. The substrate has an opening therein. The dielectric block is present in the opening of the substrate. The dielectric block has at least one first via therein, in which the dielectric block has a dielectric constant smaller than that of the substrate. The first conductor is present in the first via of the dielectric block.

According to some embodiments, an interconnect structure is provided. The interconnect structure includes a substrate, a dielectric block, a conductor, and a shielding element. The substrate has an opening therein. The dielectric block is present in the opening of the substrate. The dielectric block has at least one via therein. The conductor is present in the via of the dielectric block. The shielding element is present around the conductor and separated from the conductor by the dielectric block.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure, comprising:
    a substrate having an opening therein;
    a dielectric block present in the opening of the substrate, the dielectric block having at least one first via therein, wherein the dielectric block has a dielectric constant smaller than that of the substrate;
    a first conductor present in the first via of the dielectric block, the first conductor having a first portion protruding out of the first via, wherein a top surface of the first portion of the first conductor is in contact with a bottom surface of the dielectric block;
    a pad present on the first conductor;
    a dielectric layer present on the substrate and having at least one second via therein to expose the pad; and
    a second conductor present in the second via and electrically connected to the first conductor through the pad.

2. The interconnect structure of claim 1, wherein the first conductor is present on a sidewall of the first via.

3. The interconnect structure of claim 1, further comprising:
a plug present in the first via.

4. The interconnect structure of claim 1, further comprising:
a shielding element present between the dielectric block and a sidewall of the opening.

5. The interconnect structure of claim 1, further comprising:
at least one conductive line present on the substrate and electrically connected to the first conductor.

6. The interconnect structure of claim 1, wherein there is at least two of the first via in the dielectric block, the interconnect structure further comprising:
at least two conductive lines present on the substrate and respectively electrically connected to at least two of the first conductors in the two of the first vias.

7. The interconnect structure of claim 1, wherein the dielectric block is substantially level with a top surface of the substrate.

8. The interconnect structure of claim 1, wherein the opening is a through hole.

9. The interconnect structure of claim 1, wherein the first conductor has a second portion protruding out of the first via, and the pad is present on the second portion of the first conductor.

10. The interconnect structure of claim 9, further comprising:
a plug present in the first via, wherein the pad is further present on the plug.

11. The interconnect structure of claim 10, wherein the plug is substantially level with a top surface of the second portion of the first conductor.

12. The interconnect structure of claim 10, wherein a width of the pad is substantially equal to a width of the second portion of the first conductor.

13. The interconnect structure of claim 1, wherein the second via is substantially tapered toward the pad.

14. The interconnect structure of claim 1, wherein the second via is filled with the second conductor.

15. The interconnect structure of claim 1, further comprising:
at least one conductive line present on a surface of the dielectric layer and electrically connected to the second conductor.

16. The interconnect structure of claim 4, wherein the dielectric block and the first conductor therein are surrounded by the shielding element.

17. An interconnect structure, comprising:
a substrate having an opening therein;
a low-k dielectric block present in the opening of the substrate, the low-k dielectric block having at least one first via therein;
a first conductor present in the first via of the dielectric block, wherein a top surface of a first portion of the first conductor is in contact with a bottom surface of the dielectric block;
a pad over the first conductor;
a dielectric layer present on the substrate and having at least one second via therein; and
a second conductor present in the second via, the second conductor being over and in contact with the pad.

18. The interconnect structure of claim 17, wherein the low-k dielectric block has a dielectric constant smaller than that of the substrate.

19. An interconnect structure, comprising:
a substrate having an opening therein;
a dielectric block present in the opening of the substrate, the dielectric block having a plurality of vias therein, wherein the dielectric block has a dielectric constant smaller than that of the substrate;
a plurality of conductors respectively present in the vias of the dielectric block and separated from each other by the dielectric block, wherein at least one of the conductors has a portion protruding out of at least one of the vias, and a top surface of the portion of the at least one of the conductors is in contact with a bottom surface of the dielectric block;
a pad present on the at least one of the conductors;
a dielectric layer present on the substrate and having at least one second via therein to expose the pad; and
a second conductor present in the second via and electrically connected to the at least one of the conductors through the pad.

* * * * *